(12) United States Patent
Andreev et al.

(10) Patent No.: US 8,957,398 B2
(45) Date of Patent: Feb. 17, 2015

(54) VIA-CONFIGURABLE HIGH-PERFORMANCE LOGIC BLOCK INVOLVING TRANSISTOR CHAINS

(71) Applicant: eASIC Corporation, Santa Clara, CA (US)

(72) Inventors: Alexander Andreev, San Jose, CA (US); Sergey Gribok, Santa Clara, CA (US); Ranko L. Scepanovic, Saratoga, CA (US); Phey-Chuin Tan, Penang (MY); Chee-Wei Kung, Penang (MY)

(73) Assignee: eASIC Corporation, Santa Clara, CA (US)

( * ) Notice: Subject to any disclaimer, the term of this patent is extended or adjusted under 35 U.S.C. 154(b) by 203 days.

(21) Appl. No.: 13/649,510

(22) Filed: Oct. 11, 2012

(65) Prior Publication Data
US 2014/0028348 A1 Jan. 30, 2014

Related U.S. Application Data

(63) Continuation-in-part of application No. 13/271,679, filed on Oct. 12, 2011, now Pat. No. 8,735,857.

(60) Provisional application No. 61/426,176, filed on Dec. 22, 2010.

(51) Int. Cl.
*H01L 27/08* (2006.01)
*H01L 47/00* (2006.01)
(Continued)

(52) U.S. Cl.
CPC .......... *H03K 19/0948* (2013.01); *G06F 17/505* (2013.01); *H03K 19/17728* (2013.01); *H03K 19/17796* (2013.01)
USPC ................. 257/2; 257/202; 257/415; 326/41; 326/47; 326/101

(58) Field of Classification Search
USPC ............. 326/41, 47, 101; 716/101, 102, 105, 716/106, 118, 119, 124–126; 257/2, 202, 257/415, 369, E27.011, E27.062, E23.151
See application file for complete search history.

(56) References Cited

U.S. PATENT DOCUMENTS 5,629,638 A 5/1997 Kumar
5,844,954 A 12/1998 Casasanta et al.
(Continued)

OTHER PUBLICATIONS

Rittman, "28nm and below, New Path and Beyond." Jan. 13, 2011 Retrieved from the Internet: <URL: http://www.tayden.com/publications/28nm%20and%20below,%20New%20Path%20and%20Beyond.pdf>.
(Continued)

*Primary Examiner* — Vibol Tan
(74) *Attorney, Agent, or Firm* — Panitch Schwarze Belisario & Nadel LLP

(57) ABSTRACT

A via-configurable logic block architecture for a Structured ASIC has a plurality of MOSFET transistor chains connected to one another through vias. In one embodiment there are three chains and the first transistor chain is a NFET transistor chain, the second transistor chain is a PFET transistor chain, and the third transistor chain is a NFET transistor chain. The first, second and third transistor chains are formed into devices made of transistors that are selected from a voltage threshold group consisting of LVT, SVT and HVT devices, where the first and third transistor chains are formed into devices from a voltage threshold group that is different from one another. In another embodiment transistor drive strength may be varied in the transistor chains of the logic block. In yet another embodiment both voltage threshold and drive strength may be varied together in a symmetrical manner.

14 Claims, 8 Drawing Sheets

(51) Int. Cl.
*H03K 19/0948* (2006.01)
*G06F 17/50* (2006.01)
*H03K 19/177* (2006.01)

(56) References Cited

U.S. PATENT DOCUMENTS

| | | | |
|---|---|---|---|
| 6,434,731 B1 | 8/2002 | Brennan et al. | |
| 7,788,614 B1 | 8/2010 | Galloway et al. | |
| 7,960,242 B2* | 6/2011 | Or-Bach et al. | 438/401 |
| 8,201,126 B1 | 6/2012 | Van Dyken | |
| 8,629,548 B1* | 1/2014 | Andreev et al. | 257/691 |
| 8,735,857 B2* | 5/2014 | Andreev et al. | 257/2 |
| 2004/0243966 A1 | 12/2004 | Dellinger | |
| 2005/0160385 A1 | 7/2005 | Coughlin, Jr. | |
| 2007/0013428 A1 | 1/2007 | Vadi et al. | |
| 2007/0188188 A1 | 8/2007 | Or-Bach et al. | |
| 2008/0010626 A1 | 1/2008 | Correale | |
| 2009/0065813 A1 | 3/2009 | Cox | |
| 2010/0157703 A1 | 6/2010 | Fischer et al. | |
| 2012/0068229 A1 | 3/2012 | Bemanian et al. | |
| 2012/0161093 A1 | 6/2012 | Andreev et al. | |
| 2013/0095580 A1 | 4/2013 | Or-Bach et al. | |
| 2014/0103959 A1* | 4/2014 | Andreev et al. | 326/41 |

OTHER PUBLICATIONS

Syndicated, "Structured and Platform ASIC Architectures Mandate Custom Physical Synthesis Solutions." The Syndicated, Newsletter [online], Dec. 2005 [retrieved on Nov. 18, 2013]. Retrieved from the Internet: <URL: http://www.synopsis.com/Community/UniversityProgram/CapsuleModule/ReconfigurableSOC.pdf> pp. 10-11.

Mei-Chen Li et al., Standard Cell Like Via-Configurable Logic Block for Structured ASICs, IEEE Computer Society Annual Symposium on VLSI, IEEE Transactions on Computer-Aided Design of Integrated Circuits and Systems, vol. 22, Vo. 6, Jun. 2003.

Fan Mo et al., PLA-Based Regular Structures and Their Synthesis, IEEE Transactions on Computer-Aided Design of Integrated Circuits and Systems, vol. 22, No. 6, Jun. 2003.

Yajun Ran et al., The Magic of a Via-Configurable Regular Fabric, Computer Design: VLSI in Computers and Processors, 2004, ICCD 2004. Proceedings IEEE International Conference, Oct. 11-13, 2004, pp. 338-343.

Ivan Sutherland et al., Logical Effort: Designing Fast CMOS Circuits, Chapter One, Feb. 16, 1999, pp. 5-13, Morgan Kaufmann Publishers.

* cited by examiner

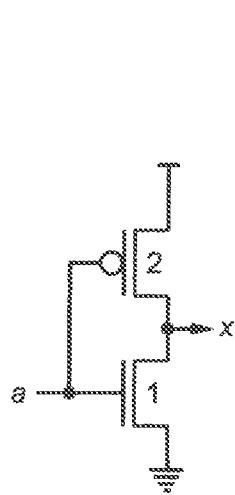 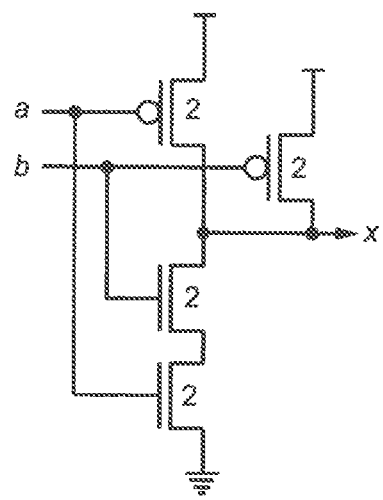 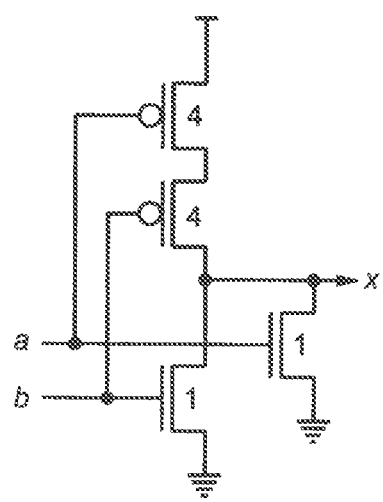
FIG. 5A
(PRIOR ART)
FIG. 5B
(PRIOR ART)
FIG. 5C
(PRIOR ART)

VIA-CONFIGURABLE HIGH-PERFORMANCE LOGIC BLOCK INVOLVING TRANSISTOR CHAINS

CROSS-REFERENCE TO RELATED APPLICATIONS

The present application claims priority to U.S. Non-Provisional Patent Application for Letters Patent of the United States, filed on Oct. 12, 2011 as U.S. application Ser. No. 13/271,679, and incorporated herein in its entirety, which depends on priority on U.S. Provisional Patent Application No. 61/426,176, filed Dec. 22, 2010, and incorporated herein in its entirety.

The present application is related to: U.S. application Ser. No. 13/649,529, for "ARCHITECTURAL FLOORPLAN FOR A STRUCTURED ASIC MANUFACTURED ON A 28 NM CMOS PROCESS LITHOGRAPHIC NODE OR SMALLER" by Alexander Andreev, Ranko Scepanovic, Ivan Pavisic, Alexander Yahontov, Mikhail Udovikhin, Igor Vikhliantsev, Chong-Teik LIM, Seow-Sung LEE, Chee-Wei KUNG, filed the same day as the present invention, Oct. 11, 2012; U.S. application Ser. No. 13/649,547, for "CLOCK NETWORK FISHBONE ARCHITECTURE FOR A STRUCTURED ASIC MANUFACTURED ON A 28 NM CMOS PROCESS LITHOGRAPHIC NODE" by Alexander Andreev, Andrey Nikishin, Sergey Gribok, Phey-Chuin TAN, Choon-Hun CHOO, filed the same day as the present invention, Oct. 11, 2012; U.S. application Ser. No. 13/649,551, for "MICROCONTROLLER CONTROLLED OR DIRECT MODE CONTROLLED NETWORK-FABRIC ON A STRUCTURED ASIC" by Alexander Andreev, Andrey Nikitin, Marian Serbian, Massimo Verita, filed the same day as the present invention, Oct. 11, 2012; U.S. application Ser. No. 13/649,563, for "TEMPERATURE CONTROLLED STRUCTURED ASIC MANUFACTURED ON A 28 NM CMOS PROCESS LITHOGRAPHIC NODE" by Alexander Andreev and Massimo Verita, filed the same day as the present invention, Oct. 11, 2012; U.S. application Ser. No. 13/649,584, for "DIGITALLY CONTROLLED DELAY LINE FOR A STRUCTURED ASIC HAVING A VIA CONFIGURABLE FABRIC FOR HIGH-SPEED INTERFACE" by Alexander Andreev, Sergey Gribok, Marian Serbian, Massimo Verita, Kee-Wei SIM, Kok-Hin LEW, filed the same day as the present invention, Oct. 11, 2012; and all assigned to the same Assignee as the present invention, all of which are specifically incorporated herein by reference.

BACKGROUND OF THE INVENTION

1. Field of Invention

The present invention relates generally to the field of Structured ASICs. Embodiments of the present invention may relate to an architecture of a configurable logic block (CLB) that may be used in a semiconductor device.

2. Description of Related Art

The present invention relates generally to an improved Structured ASIC (Structured Application Specific Integrated Circuit). Broadly defined, structured application-specific integrated circuits (ASICs) may attempt to reduce the effort, expense and risk of producing ASICs by standardizing portions of the physical implementation across multiple products. By amortizing the expensive mask layers of the device across a large set of different designs, the non-recurring engineering (NRE) for a customized ASIC seen by a particular customer, which are one-time costs that do not depend on the number of units sold, can be significantly reduced. There may be additional benefits to the standardization of some portion of mask set, which may include improved yield through higher regularity and/or reduced manufacturing time from tape-out to packaged chip.

ASICs can be broken down further into a full-custom ASIC, a Standard Cell-based ASIC (standard-cell), a Structured ASIC, and a gate array ASIC. At the opposite end of an ASIC is a field-programmable gate array (FPGA), an integrated circuit designed to be configured by the customer or designer after manufacturing in the field using software commands rather than at a foundry or IC fab. Other non-ASICs include simple and complex PLDs (Programmable Logic Devices), and off-the-shelf small and medium scale IC components (SSI/MSI). Further classifications include a Configurable Logic Block (CLB). A configurable logic block (CLB) may be an element of field-programmable gate array (FPGA), structured application-specific integrated circuit (ASIC) devices, and/or other devices. CLBs may be configured, for example, to implement different logic cells (combinational, such as NANDs, NORs, or inverters, and/or sequential, such as flip-flops or latches).

A full-custom ASIC customizes every layer in an ASIC device, which can have 10 to 15 layers, requiring in a lithography process 10 to 15 masks. Since the customized design of the ASIC occurs at the transistor level, and modern ASICs have tens if not hundreds of millions of transistors, a full-custom ASIC is typically economically feasible only for applications that required millions of units. An example of such an application is the cell phone digital modem or a flat panel television video processing device.

In a standard cell ASIC, circuits are constructed from predefined logic components known as cells. Designers work at the gate level not the finer transistor level, simplifying the process. The fab manufacturing the device provides a library of basic building blocks that can be used in the cells, such as basic logic gates, combinational components (and-or-inverter, multiplexer, 1-bit full adder), and basic memory, such as D-type latch and flip-flop. A library of other function blocks such as adder, barrel shifter and random access memory (RAM) may also exist. While the layout of each cell in a standard cell is predetermined, the circuit itself has to be uniquely constructed by connecting all layers to one another and the cells within each layer in a custom manner, which takes time and effort.

In a gate-array ASIC, the level of abstraction is one level higher than a standard cell, in that each building block in a gate array is from an array of predefined cells, known as a base cell, which resembles a logic gate. Since location and type of cell is predetermined, gate-array ASICs can be manufactured in advance in greater quantities and inventoried for use later. A circuit is manufactured by customizing the interconnect between these cells, which is done at the metal interconnect masks. As in gate level ASICs, typically 3 to 5 metal layers have to be customized to specify the interconnect required to complete the circuit, which simplifies the manufacturing process.

In a Structured ASIC the level of abstraction is somewhere between the full-custom ASIC and the FPGA. In a Structured ASIC there may be a dozen or more metal layers, but in many structured ASICs not all metal layers need be for routing, and some layers may be pre-routed, and only the top layers are used for routing. The idea behind the structured ASIC is that the most of the layers are predefined; only a few metal or via layers are available for customization. An extreme case is the eASIC structured ASIC, assignee to this invention: only a single via layer is available for customization, and all the other layers are predefined. This reduces the complexity of the manufacturing process, since non-recurring engineering costs are much lower, as photolithographic masks are required only for the fewer metal layers not for every layer, and production cycles are much shorter, as metallization is a comparatively quick process. The metal layers may be interconnected with one another at select vertical holes called vias that are filled with conductive material, which can be called the 'via' metal layer, and thus be configurable at this layer, or 'via configurable'. If the logic fabric comprising the Structured ASIC is configured with traditional IC optical lithography involving photolithographic masks, it can be thought of as "mask programmable". In some designs, such as by the present assignee to this invention, eASIC Corporation, the customizable metallization layers may be reduced to a few or even a single via layer where the customization is performed, see by way of example and not limitation U.S. Pat. No. 6,953,956, issued to eASIC Corporation on Oct. 11, 2005; U.S. Pat. No. 6,476,493, issued to eASIC Corporation on Nov. 5, 2002; and U.S. Pat. No. 6,331,733, issued to eASIC Corporation on Dec. 18, 2001; all incorporated herein by reference in their entirety. Further, a single via connection layer could be customized without resorting to mask-based optical lithography, but with a maskless e-beam process, as taught by the '956 patent.

A complex field programmable device is a most versatile non-ASIC, as the generic logic cells, which can sometimes be more sophisticated than ASIC cells, and the interconnect structure, can be programmable in the field using software rather than at a fab using for example photolithographic masks. A complex field programmable device can be re-programmed to a different circuit in hours, rather than only being programmable once at a fab like an ASIC. A complex field programmable device can be broadly divided into two categories, a Complex Programmable Logic Device (CPLD) and a Field Programmable Gate Array (FPGA). The logic cell of a CPLD is more complex than an FPGA, and has a D-type flip-flop and a programmable logic device semiconductor such as a PAL™ type programmable logic device semiconductor, with configurable product terms. The interconnect of a CPLD is more centralized, with fewer concentrated routing lines. A FPGA logic cell is smaller, with a D-type flip-flop and a small Look Up Table (LUT), a multi input and single output block that is widely used for logic mapping, or multiplexers for routing signals through the interconnect and logic cells. The FPGA design that defines a circuit is stored in RAM, so when the FPGA is powered off, the design for the circuit disappears. When the FPGA is powered back up, one must reload the circuit design from non-volatile memory.

A simple PLD, historically called a programmable logic device, is much more limited in application, as they do not have a general interconnect structure. Today these devices are relatively rare by themselves and are now used as internal components in an ASIC or CPLD. Likewise, off-the-shelf small and medium scale IC components (SSI/MSI) are rarely used anymore, as they are first generation devices such as the 7400 series transistor-transistor logic (TTL) manufactured by various companies used in the 1960s and 70s to build computers. These components are no longer supported by modern EDA (Electronic Design Automation) software and have very limited functionality.

A complex field programmable device can be thought of as a form of programmable logic fabric. One such programmable logic fabric is a SRAM programmable Look-Up Table (LUT) technology that forms the basis of Field Programmable Gate Arrays and Complex Programmable Logic Devices. The programmable fabric technology allows synthesis of a logic design described in a Hardware Description Language (HDL) to be synthesized on to the logic fabric in order to perform the required logic function. The logic fabric includes memory blocks, embedded multipliers, registers and Look-Up Table logic blocks. Interconnect between logic elements is also SRAM programmable. As the state of the SRAM is deleted when powered off, the function of the programmable logic fabric incorporating SRAM can be changed.

ASIC design flow as a whole is a complex endeavor that involves many tasks, as described further herein, such as: logic synthesis, Design-for-Test (DFT) insertion, Electric Rules Check (ERC) on gate-level netlist, floorplan, die size, I/O structure, design partition, macro placement, power distribution structure, clocks distribution structure, preliminary check, (e.g., IR drop voltage drop, Electrostatic Discharge (ESD)), placement and routing, parasitic extraction and reduction (parasitic devices), Standard Delay Format (SDF) timing data generated by EDA tools, various checks including but not limited to: static timing analysis, cross-talk analysis, IR drop analysis, and electron migration analysis.

At the first step in the ASIC design flow, the design entry step, the circuit is described, as in a design specification of what the circuit is to accomplish, including functionality goals, performance constraints such as power and speed, technology constraints like physical dimensions, and fabrication technology and design techniques specific to a given IC foundry. Further in the design entry step is a behavioral description that describes at a high-level the intended functional behavior of the circuit (such as to add two numbers for an adder), without reference to hardware. Next is a RTL (Register Transfer Language) structural description which references hardware, albeit at a high-level of abstraction using registers. RTL focuses on the flow of signals between registers, with all registers updated in a synchronous circuit at the same time in a given clock cycle, which further necessitates in the design flow that the clocks be synchronized and the circuits achieve timing constraints and timing closure. RTL description captures the change in design at each clock cycle. All the registers are updated at the same time in a clock cycle for a synchronous circuit. A synchronous circuit consists of two kinds of elements: registers and combinational logic. Registers have a clock, input data, output data and an enable signal port. Every clock cycle the input data is stored internally and the output data is updated to match the internal data. Registers, often implemented as flip-flops, synchronize the circuit's operation to the edges of the circuit clock signal, and have memory. Combinational logic performs all the logical functions in the circuit and it typically consists of logic gates. RTL is expressed usually in a Verilog or VHDL Hardware Description Language (HDL), which are industry standard language descriptions. A hardware description language (HDL) is a language used to describe a digital system, for example, a network switch, a memory or a flip-flop. By using a HDL one can describe any digital hardware.

A design flow progresses from logical design steps to more physical design steps. Throughout this flow timing is of critical importance and must be constantly reassessed so that timing closure is realized throughout the circuit, since timing between circuits could change at different stages of the flow. Furthermore, the circuit must be designed to be tested for faults. The insertion of test circuitry can be done at the logic synthesis step, where register transfer level (RTL), is turned into a design implementation in terms of logic gates such as a NAND gate. Thus logic synthesis is the process of generating a structural view from the RTL design output using an optimal number of primitive gate level components (NOT, NAND, NOR, and the like) that are not tied to a particular device technology (such as 32 nm features), nor do with any information on the components' propagation delay or size. In logical synthesis the circuit can be manipulated with Boolean algebra. Logical synthesis may be divided into two-level synthesis and multilevel synthesis. Because of the large number of fan-ins for the gates (the number of inputs to a gate), two-level synthesis employs special ASIC structures known as Programmable-Logic Arrays (PLA) and modified Programmable Array Logic (PAL)-based CPLD devices. Multilevel synthesis is more efficient and flexible, as it eliminates the stringent requirements for the number of gates and fan-ins in a design, and is preferred. The multilevel synthesis implementation is realized by optimizing area and delay in a circuit. However, optimizing multilevel synthesis logic is more difficult than optimizing two-level synthesis logic, and often employs heuristic techniques.

Functional synthesis is performed at the design entry stage to check that a design implements the specified architecture. Once Functional Verification is completed, the RTL is converted into an optimized gate level netlist, using smaller building blocks, in a step called Logic Synthesis or RTL synthesis. In EDA this task is performed by third party tools. The synthesis tool takes an RTL hardware description and a standard cell library for a particular manufacturer as input and produces a gate-level netlist as output. The standard cell library is the basic building block repository for today's IC design. Constraints for timing, area, speed, testability, and power are considered. Synthesis tools attempt to meet constraints by calculating the engineering cost of various implementations. The tool then attempts to generate the best gate level implementation for a given set of constraints, target the particular manufacturing process under consideration. The resulting gate-level netlist is a completely structural description with only standard cells at the "leaves" of the design. At logical/RTL synthesis it is also verified whether the Gate Level Conversion has been correctly performed by performing simulation. The netlist is typically modified to ensure any large net in the netlist has cells of proper drive strength (fan out), which indicates how many devices a gate can drive. A driving gate can be any cell in the standard cell library. During compilation of the netlist the EDA tool many adjust the size of the gate driving each net in the netlist so that area and power is not wasted in the circuit by having too large of a drive strength. Buffer cells are inserted when a large net is broken into smaller sections by the EDA tool.

Throughout the logical design state, an EDA tool performs a computer simulation of the layout before actual physical design.

The next step in the ASIC flow is the physical Implementation of the gate level netlist, or physical design, such as system partitioning, floorplanning, placement and routing. The gate level netlist is converted into a geometric representation of the layout of the design. The layout is designed according to the design rules specified in the library for the fab that is to build the digital device. The design rules are guidelines based on the limitations of the fabrication process.

The Physical Implementation step consists of several sub steps: system partitioning, floorplanning, placement and routing. These steps relating to how the digital device is to be represented by the functional blocks, as one ASIC or several (system partitioning), how the functional blocks are to be laid out on one ASIC (floorplanning) and how the logic cells can be placed within the functional blocks (placement) and how these logic cells are to be interconnected with wiring (routing). The file produced at the output of this Physical Implementation is the so-called GDSII file, which is the file used by the foundry to fabricate the ASIC.

For any design to work at a specific speed, timing analysis has to be performed throughout the ASIC design flow. One must check using a Static Timing Tool in EDA whether the design is meeting the speed requirements of the specification. Industry standard Static Timing tools include Primetime (Synopsys), which verifies the timing performance of a design by checking the design for all possible timing violations caused by the physical design process.

During placement, for example, timing is effected since the length of an interconnect caused by placement changes the capacitance of the interconnect and hence changes the delay in the interconnect. The goal of an EDA placement tool is to arrange all the logic cells within the flexible blocks on a chip to achieve objectives such as: guarantee the router can complete the routing step, minimize all the critical net delays, make the chip as dense as possible, minimize power dissipation, and minimize cross talk between signals. Modern EDA placement tools use even more specific and achievable criteria than the above. The most commonly used placement objectives are one or more of the following: minimize the total estimated interconnect length, meet the timing requirements for critical nets, and minimize the interconnect congestion.

Algorithms for placement do exist, for example, the minimum rectilinear Steiner tree (MRST) is the shortest interconnect using a rectangular grid. The determination of the MRST is in general a NP-complete problem—which is difficult to solve in a reasonable time. For small numbers of terminals heuristic algorithms exist, but they are expensive in engineering cost to compute. Several approximations to the MRST exist and are used by EDA tools.

In the routing step, the wiring between the elements is planned. A Structured ASIC cross-section has metal layers; in a standard cell ASIC there may be nine metal layers, but in many structured ASICs not all metal layers need be for routing, and some layers may be pre-routed, and only the top layers are used for routing. The metal layers may be interconnected with one another at select vertical holes called vias that are filled with conductive material and/or can be made to conduct, which may be called the 'via' connection layer or via metal layer, and thus be configurable at this layer, or 'via configurable'. If the logic fabric comprising the Structured ASIC is configured with traditional IC optical lithography involving photolithographic masks, it can be thought of as "mask programmable". In some designs, such as by the present assignee to this invention, eASIC Corporation, the customizable metallization layers may be reduced to a single via connection layer where the customization is performed, see by way of example and not limitation U.S. Pat. No. 6,953,956, issued to eASIC Corporation on Oct. 11, 2005, and incorporated herein by reference in its entirety.

During circuit extraction and post layout simulation, a back-annotated netlist is used with timing information to see if the physical design has achieved the objectives of speed, power and the like specified for the design. If not, the entire ASIC design flow process is repeated. In modern EDA tools the delays calculated from a simulation library of library cells used in the design, during physical design steps, are placed in a special file called the SDF (Synopsys Delay Format) file. Each cell can have its own delay based on where in the netlist it is found, what are its neighboring cells, the load on the cell, the fan-in, and the like. Each internal path in a cell can have a different propagation time for a signal, known as a timing arc. The maximum possible clock rate is determined by the slowest logic path in the circuit, called the critical path.

Compounding the problem of delay is that in a synchronous ASIC one must avoid clock skew, and different parts of the ASIC may have different clock domains controlling them, with the wiring nets that establish the clock signal forming a clock net branching out in the form of a clock tree. Establishing this tree, which often requires additional circuitry like buffer cells to help drive the massive clock tree, is called clock tree synthesis. As an ASIC is a synchronous circuit, all the clocks in the clock tree must be in synch and chip timing control achieved, typically by using Phase-Locked Loops (PLLs) and/or Delay-Locked Loops (DLLs). If the clock signal arrives at different components at different times, there is clock skew. Clock skew can be caused by many different things, such as wire-interconnect length, temperature variations and differences in input capacitance on the clock inputs of devices using the clock. Further, timing must satisfy register setup and hold time requirements. Both data propagation delay and clock skew play important parts in these calculations. Problems of clock skew can be solved by reducing short data paths, adding delay in a data path, clock reversing and the like. Thus during the physical synthesis steps, clock synthesis is an important step, which distributes the clock network throughout the ASIC and minimizes the clock skew and delay.

Finally, IP in the form of proprietary third party functionality such as a semiconductor processor may be embedded in an ASIC using soft macros, firm macros and hard macros that can be bought from third parties. A soft macro describes the IP as RTL code and does not have timing closure given the design specification nor layout optimization for the process under consideration. However as RTL code a soft macro can be modified by a designer with EDA tools and synthesized into the designer's library. By contrast, a hard macro is timing-guaranteed and layout-optimized for a particular design specification and process technology but is not portable outside the particular design and process under consideration, but is not represented in RTL code; rather a hard macro is tailored for a particular foundry and closer to GDSII layout. A firm macro falls between a hard macro and a soft macro. Firm macros are in netlist format, are optimized for performance/area/power using a specific fabrication technology, are more flexible and portable than hard macros, and more predictive of performance and area to be used than soft macros. Macros obviate a designer having to design every component from scratch, and are a great time saver. Third party designers favor firm and hard macros since it is easier to hide intellectual property (IP) present in such macros than it is to hide such IP in a soft macro.

Given the above, the pros and cons of standard cell ASICs versus a complex field programmable device such as an FPGA is as follows. The advantages of FPGAs are that they can be easy to design, have shorter development times and thus are faster in time-to-market, and have lower NRE costs. These are also the disadvantages of standard cell ASICs: they can be difficult to design, have longer development times, and higher NRE costs. The disadvantages of FPGAs are that design size is limited to relatively small production designs, design complexity is limited, performance is limited, power consumption is high, and there is a high cost per unit. These FPGA disadvantages are standard-cell advantages, as standard cells support large and complex designs, have high performance, low power consumption and low per-unit cost at a high volume.

A Structured ASIC falls between an FPGA and a Standard Cell-based ASIC in classification and performance. Structured ASIC's are used for mid-volume level designs. In a Structured ASIC the task for the designer is to map the circuit into a fixed arrangement of known cells.

Structured ASICs are closer to standard-cells in their advantages over FPGAs. The disadvantage of structured ASICs compared to FPGAs is that FPGAs do not require any user design information during manufacturing. Therefore, FPGA parts can be manufactured in larger volumes and can exist in larger inventories. This allows the latency of getting parts to customers in the right volumes to be reduced. FPGAs can also be modified after their initial configuration, which means that design bugs can be removed without requiring a fabrication cycle. Design improvements can be made in the field, and even done remotely, which removes the requirement of a technician to physically interact with the system.

Given these pros and cons, structured ASICs combine the best features of FPGAs and standard cell ASICS. Structured ASIC advantages over standard cell ASICs and FPGAs include that they are largely prefabricated, with components are that are almost connected in a variety of predefined configurations and ready to be customized into any one of these configurations. Fewer metal layers are needed for fabrication of a Structured ASIC, which dramatically reduces the turnaround time. Structured ASICs are easier and faster to design than standard cell ASICs. Multiple global and local clocks are prefabricated in a Structured ASIC. Consequently, there are no skew problems that need to be addressed by the ASIC designer. Thus signal integrity and timing issues are inherently addressed, making design of a circuit simpler and faster. Capacity, performance, and power consumption in a Structured ASIC is closer to that of a standard cell ASIC. Further, structured ASICs have faster design time, reduced NRE costs, and quicker turnaround than standard cell ASICs. Thus with structured ASICs the per-unit cost is reasonable for several hundreds to 100 k unit production runs.

Compared to a field-programmable gate array (FPGA), the unit price of a Structured ASIC solution may be reduced by an order of magnitude due to the removal of the storage and logic required for configuration storage and implementation. The unit cost of a Structured ASIC may be somewhat higher than a full custom ASIC, primarily due to the imperfect fit between design requirements and a standardized base layer, with certain I/O, memory and logic capacities. An ideal ASIC device may combine the field programmability of FPGAs with the power and size efficiency of ASICs or structured ASICs.

Complementary metal-oxide-semiconductor (CMOS) is a technology for constructing integrated circuits. CMOS is sometimes referred to as complementary-symmetry metal-oxide-semiconductor (or COS-MOS). The words "complementary-symmetry" refer to the fact that the typical digital design style with CMOS uses complementary and symmetrical pairs of p-type and n-type metal oxide semiconductor field effect transistors (MOSFETs) for logic functions (P-type MOSFETs and N-type MOSFETs). Complementary Metal-Oxide-Silicon circuits require an nMOS and pMOS transistor technology on the same substrate. An n-type well is provided in the p-type substrate. Alternatively one can use a p-well or both an n-type and p-type well in a low-doped substrate. The gate oxide, poly-silicon gate and source-drain contact metal are typically shared between the pMOS and nMOS technology, while the source-drain implants are done separately. Since CMOS circuits contain pMOS devices, which are affected by the lower hole mobility, CMOS circuits are not faster than their all-nMOS counter parts. Even when scaling the size of the pMOS devices so that they provide the same current, the larger pMOS device has a higher capacitance.

The CMOS advantage is that the output of a CMOS inverter can be as high as the power supply voltage and as low as ground. This large voltage swing and the steep transition between logic levels yield large operation margins and therefore also a high circuit yield. In addition, there is no power dissipation in either logic state. Instead the power dissipation occurs only when a transition is made between logic states. CMOS circuits are therefore not faster than nMOS circuits but are more suited for very/ultra large-scale integration (VLSI/ULSI).

A System-in-Package (SiP) are multiple bare dice and/or chip-scale package (CSP) devices, each implementing their own function (e.g., analog, digital, and radio frequency (RF) dice) that are mounted on a SiP common substrate, which is used to connect them together. The substrate and its components are then placed in (or built into) a single package, called a IC (Integrated Circuit) or SiP, which is a traditional two-dimensional (2D) chip. A 2.5D IC/SiP is different from a traditional 2D IC/SiP, and in one type of 2.5D IC a silicon interposer is placed between the SiP common substrate and the dice, where this silicon interposer has through-silicon vias connecting the metallization layers on the upper and lower surfaces of the silicon interposer. The multiple bare dice can be attached to the silicon interposer using micro-bumps, which are about ~10 um in diameter, and in turn the silicon interposer is attached to the SiP substrate using regular flip-chip bumps, which can be ~100 um in diameter. Further, a 3D IC/SiP configuration enable designers to achieve higher levels of integration by allowing multiple die to be stacked vertically on top of one another. Wire bonds connect a topmost die with an underlying SiP substrate and allow the topmost die to communicate with a SiP substrate that is covered by an underlying die.

ASIC CMOS integrated circuit libraries offer transistors that have multiple threshold voltages, with circuits comprised of Standard Voltage Thresholds (SVT) transistors consuming less power than circuits comprised of Low Voltage Threshold (LVT) transistors, which have greater IC leakage current. LVT devices however offer higher circuit performance, as the LVT transistors turn on faster. A third category of threshold voltage device are High-Vt (HVT) transistors, which are the slowest transistors but consume the least amount of power.

A FET (Field Effect Transistor) is a transistor that uses an electric field to control the conductivity of a charge carrier channel in a semiconductor. A common type of FET is the Metal Oxide Semiconductor FET (MOSFET). MOSFET work by inducing a conducting channel between two contacts called the source and the drain by applying a voltage on the oxide-insulated gate electrode. Two types of MOSFET are called nMOSFET (commonly known as nMOS or NFET) and pMOSFET (commonly known as pMOS or PFET) depending on the type of carriers flowing through the channel. A nMOS transistor is made up of n-type source and drain and a p-type substrate. The three modes of operation in a nMOS are called the cut-off, triode and saturation. The nMOS logic is easy to design and manufacture, but devices made of nMOS logic gates dissipate static power when the circuit is idling, since DC current flows through the logic gate when the output is low. By contrast, a pMOS transistor is made up of p-type source and drain and a n-type substrate; pMOS technology is low cost and has a good noise immunity. In a nMOS, carriers are electrons, while in a pMOS, carriers are holes; since electrons travel faster than holes, all things being equal NFETs are twice as fast as PFETs. When a high voltage is applied to the gate, with the gate-source voltage exceeding some threshold value ($V_{GS} > V_{TH}$), the nMOS will conduct, while pMOS will not; and conversely when a low voltage is applied in the gate, nMOS will not conduct and pMOS will conduct. PFETs are normally closed switches and NFETs are normally open switches. PFETs often occupy more silicon area than NFETs when forming logic blocks. pMOS devices are more immune to noise than nMOS devices. Furthermore, nMOS ICs are smaller than pMOS ICs with the same functionality, since the nMOS can provide one-half of the impedance provided by a pMOS under the same geometry and operating conditions.

In a CMOS transistor, the drive strength of the transistor is related to the current a transistor can drive through it and the faster it can switch. Drive strength is related to so-called aspect ratio and W/L of a transistor; increasing W/L increases the drive strength to a higher value from say 1× to 2×, 3× and so on, with non-integer multiples like 1.5× also allowed. The higher the drive strength the quicker the transistor switches or the quicker is the cell that is constructed by the transistor, with the tradeoff that the cell will consume more power and more area with a higher drive strength.

SUMMARY OF THE INVENTION

Accordingly, an aspect of the present invention is to provide an implementation of a Structured ASIC, manufactured using a CMOS process using NFET/nMOS and PFET/pMOS transistors, which may include a via-configurable logic block (VCLB) architecture. VCLB configuration and/or configuration between elements in the Structured ASIC may be performed by changing properties of so called "configurable vias"—connections between VCLB internal nodes or between elements in the Structured ASIC. A programmable via may be in one of two possible states: it may be either enabled or disabled. If a programmable via is enabled, then it can conduct a signal (i.e., the via exists and has low resistance). If a via is disabled, then it cannot practically conduct a signal, i.e., the via has very high resistance or does not physically exist. VCLBs may be used in structured ASIC devices.

Another aspect of the present invention is to provide a type of Structured ASIC that may use serial/parallel transistor structures. One may consider two or more serially connected transistors, where the drain of the first transistor may be connected to the source of the second transistor; the drain of the second transistor may be connected to the source of the third transistor, and so on. The drain of the first transistor and the source of the last transistor may be left hanging (i.e., unconnected). One may call this group of interconnected transistors a "transistor chain".

Another aspect of the present invention is to provide a type of VCLB as described herein that is manufactured on a 28 nm or smaller CMOS process lithographic node.

A further aspect of the present invention is to provide a type of VCLB that uses a series of P-type and N-type FET transistor chains in parallel, comprised of LVT, SVT and HVT voltage threshold transistors for maximum designer flexibility.

Another aspect of the present invention is to provide LVT, SVT or HVT type transistors in NFET/nMOS and PFET/pMOS transistor chains that conserve power or maximize performance.

Yet another aspect of the present invention is to provide a single via-configurable layer for the semiconductor device described herein.

Another aspect of an embodiment of the present invention is to vary the drive strength of several transistor chains operating in parallel so that performance may be increased with a tradeoff in power consumption and area occupied.

Yet another aspect of the present invention is to vary both the types of voltage threshold transistors and drive strength in a single architecture.

The sum total of all of the above advantages, as well as the numerous other advantages disclosed and inherent from the invention described herein, creates an improvement over prior techniques.

The above described and many other features and attendant advantages of the present invention will become apparent from a consideration of the following detailed description when considered in conjunction with the accompanying drawings.

BRIEF DESCRIPTION OF THE DRAWINGS

Detailed description of preferred embodiments of the invention will be made with reference to the accompanying drawings. Disclosed herein is a detailed description of the best presently known mode of carrying out the invention. This description is not to be taken in a limiting sense, but is made merely for the purpose of illustrating the general principles of the invention. The section titles and overall organization of the present detailed description are for the purpose of convenience only and are not intended to limit the present invention.

FIGS. 5A, 5B and 5C are prior art schematics of simple logic gates comprising an inverter, two-input NAND gate and two-input NOR gate.

Figures 1, 2:
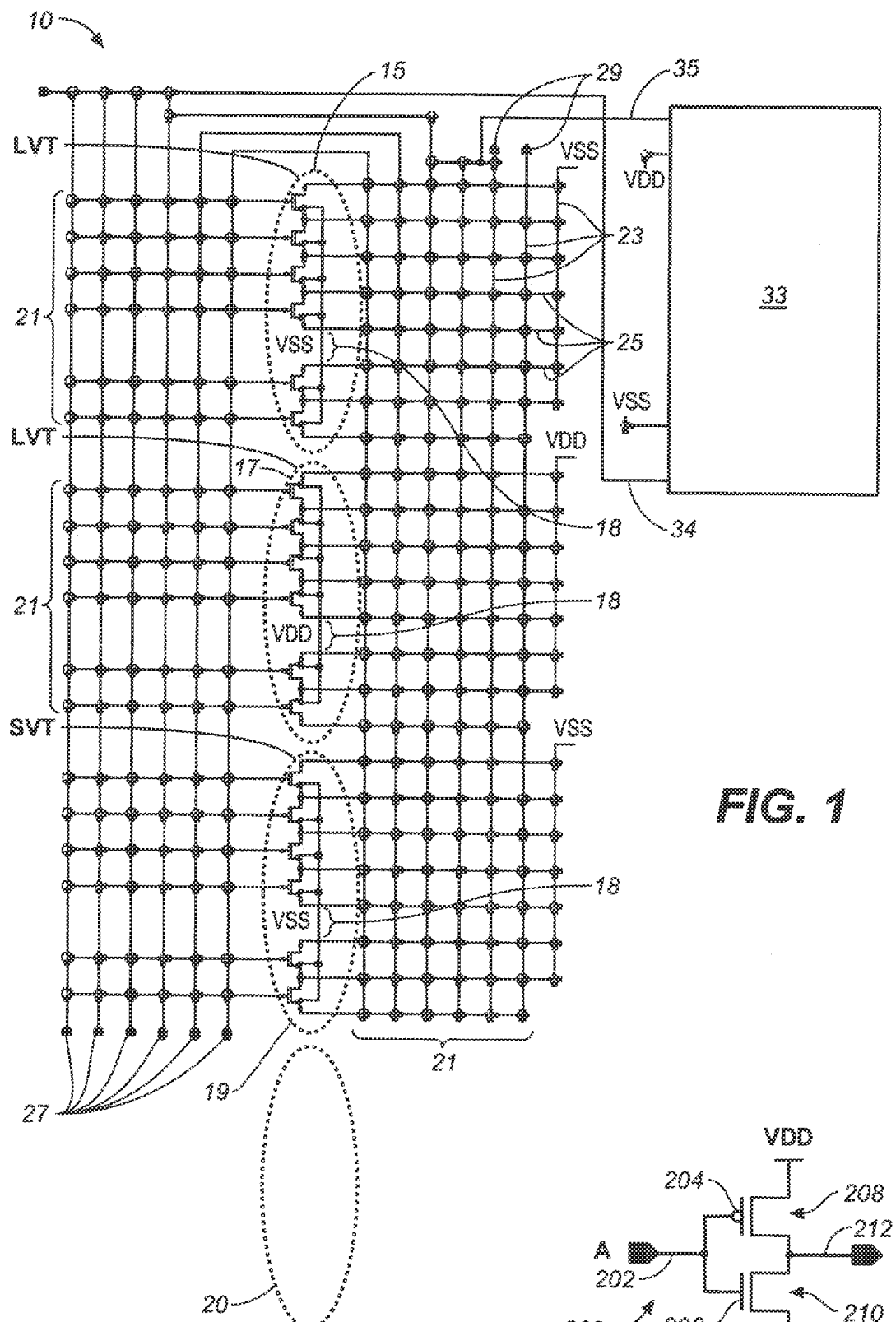
FIG. 1 is a schematic of one embodiment of the invention showing pMOS-pMOS-nMOS VCLB for a Structured ASIC with an array of configurable vias.
FIG. 2 is a schematic of a static CMOS inverter logic gate using nMOS and pMOS transistors.

It should be understood that one skilled in the art may, using the teachings of the present invention, vary embodiments shown in the drawings without departing from the spirit of the invention herein. In the figures, elements with like numbered reference numbers in different figures indicate the presence of previously defined identical elements.

DETAILED DESCRIPTION OF THE INVENTION

The method and apparatus of the present invention may be described in software, such as the representation of the invention in an EDA tool, or realized in hardwire, such as the actual physical instantiation.

According to an embodiment of the invention, e.g., as shown in FIG. 1, is a schematic of one embodiment of the invention showing a pMOS-pMOS-nMOS configuration VCLB or element 10 for a semiconductor device or Structured ASIC, with an array of configurable vias. Three transistor chains 15, 17 and 19 are formed side-by-side. The transistors are preferably FET transistors, with nMOSFET transistors, which form N-type transistors, forming chain 15, also marked "LVT" in dotted lines, pMOSFET transistors, which form P-type transistors, forming chain 17, also marked "LVT" in dotted lines, and nMOSFET transistors, which form N-type transistors, forming chain 19, also marked "SVT" in dotted lines. The designation of "LVT" and "SVT" refer to these transistor chains being formed into Low Voltage Threshold (LVT) transistors and Standard Voltage Thresholds (SVT) transistors, respectively, as will be explained further herein.

The P-chain and N-chain may have the same or different numbers of transistors. The P-chain typically has a plurality of P-chains and the N-chain typically has a plurality of N-chains forming a circuit or cell in a Structured ASIC. Thus there may be multiple P-chains and/or N-chains, and there need not be the same number of P-chains and N-chains. One may consider two or more serially connected transistors, where the drain of the first transistor may be connected to the source of the second transistor; the drain of the second transistor may be connected to the source of the third transistor, and so on. The drain of the first transistor and the source of the last transistor may be left hanging (i.e., unconnected). One may call this group of interconnected transistors a "transistor chain". Or, the chain may be broken at some point in the P-chain or N-chain between source and drain, so the drain and sources are not connected, such as at gap 18 in the three transistor chains or groups 15, 17 and 19, without loss of generality and still calling these groups of transistors a "chain" (even with a break in the chain). The corresponding structure is a plurality of P-type or N-type semiconductors arranged as alternating pFET or nFET transistors in groups as shown, in a substantially serially connected manner, with or without breaks in the groups as in break 18, forming a structure that can be called a chain, chain group or chain island in the singular.

Further though three transistor chains are shown in a preferred embodiment in the present invention, side by side on the same silicon area, in general the chains may be separated from each other if to achieve the same functionality, without loss of generality. Consistent with this, a fourth chain island group 20 may be disposed on the chip, such as shown in outline block form in FIG. 1. All sources/drains/gates of the transistors in the chains may generally be connected to a via-configurable routing fabric, shown as fabric 21, with the fabric comprised of the intersection of routing signal lines such as vertical lines 23 and horizontal lines 25 that are connected by vias shown as circles at the intersection of vertical lines 23 and horizontal lines 25. This fabric that connects transistors and groups of transistors to one another for ease in terminology can be called via-configurable interconnections, with a predetermined number of these vias filled to connect certain transistors to one another, to program, configure and customize an ASIC incorporating the fabric, depending on the design functionality requested by the ASIC designer. Equivalently, an alternative structure that performs the same function as vias connecting signal conducting pathways, such as having a number of predetermined routes, with or without the use of regularly spaced vias, is envisioned by this terminology. The fabric/via-configurable interconnections may also be connected to external ports such as input lines 27 and output lines 29, and/or power lines ($V_{DD}$) and/or ground lines ($V_{SS}$). In FIG. 1, the via-configurable routing fabric 21 may include configurable vias (shown as circles at the intersection of lines 23 and 25) located at potential connection points, e.g., connecting to the various transistors, the $V_{DD}$ power line, the $V_{SS}$ ground line, the input or output terminals 27 and 29, or any other lines and traces in the element 10 for the Structured ASIC.

Suitable optional control circuitry such as a muxing circuit 33, having at least one input 34 and at least one output 35, with suitable power Vdd and ground Vss, may be situated in the VCLB/Structured ASIC 10, to drive any logic gates in the fabric.

If there are no vias enabled in the fabric, then there are no direct connections between transistors in the chains and the various external ports and/or $V_{DD}$ and/or ground lines. An exception can be that some (but not all) gates of transistors in P-chain may be directly connected (hardwired) to the gates of transistors in N-chain. However, it is contemplated that, according to embodiments of the invention, at least one transistor of one transistor chain (the P-chain or the N-chain) may not be directly connected (hardwired) to a transistor of the other transistor chain. It is also contemplated that in the via-configurable routing fabric, there may be via-configurable connections between transistors of the P-chain and the N-chain (or more than one P-chain and more than one N-chain) and that these connections need not be strictly between P-type and N-type transistors arranged in parallel (e.g., opposite each other or in corresponding positions) in the P-chain(s) and N-chain(s); rather, any P-type transistor of the P-chain(s) may have a via-configurable connection to any N-type transistor of the N-chain(s). In general, the via-configurable connections may be between all transistors of the P-chain(s) and all transistors of the N-chain(s), or they may permit only a subset of the transistors of either or both of the P-chain(s) and N-chain(s) to be connected to each other using via-configurable connections.

By inserting vias in the routing fabric 21 it may be possible to establish connections between the transistors, $V_{DD}$ Power/$V_{SS}$ Ground lines and/or external ports. In so doing, one may create different types of combinational and/or sequential logic blocks (where state information is preserved or latches or memory are present) by means of such connections. Such logic blocks need not be limited to a single logic function, such as and inverter, NAND or NOR, but may include multiple logic functions in a single block. So, too, combination and/or sequential logic functions may be implemented.

While the via-configurable connection fabric may be implemented so as to form configurable connections between metal layers Mi and an adjacent layer M i+1, where i=an integer, of a multi-layer circuit architecture, the invention is not thus limited. It is contemplated that, according various embodiments of the invention, configurable vias may be established to permit connections involving one or more metal layers higher than M i+1, or which may be implemented at one or more of such higher metal layers.

The transistors may be manufactured using CMOS technology, and laid out in parallel such as shown in groups of transistor chains 15, 17 19, with the following convention in the preferred embodiment of FIG. 1: transistor chain 15, formed of nMOSFET transistors, is made into LVT transistors, which consume more power than SVT transistors but are faster; transistor chain 19, formed of nMOSFET transistors, is made into SVT transistors, and transistor chain 17, sandwiched in-between chains 15, 19 and formed of pMOSFET transistors, is made into LVT transistors, which switch faster and offer higher circuit performance than SVT formed transistors.

However, while a NFET-PFET-NFET transistor chain configuration that is formed into LVT-LVT-SVT transistor devices, respectively, is contemplated, other configurations, such as PFET-NFET-PFET transistors formed into LVT-LVT-SVT devices, respectively, is also possible, or any other combination thereof in accordance with the teachings of the present invention. What is important is that the first transistor chain, transistor chain 15 in FIG. 1, differs from the third transistor chain, transistor chain 19 in FIG. 1. Hence for three chains of PFET-NFET-PFET transistors one can form them into LVT-SVT-SVT devices, with no loss of generality, as the second chain of transistors, transistors 17 in FIG. 1, is not as relevant as the first and third chains, chains 15 and 19, respectively. In addition, HVT transistor chains may be introduced. For example, if one uses LVT for high power/high leakage but fast switching transistors, and SVT for normal leakage, lower power consuming transistors, one may also introduce HVT transistors (High-VT) transistors for even lower than SVT power leakage use but even slower switching and lower critical timing than SVT transistors. The permutations can be, for three transistor chains, as shown below in the table at Table 1.

For example, the first row in Table 1 below is as shown in FIG. 1: LVT-*-SVT threshold voltage types of transistors for the three transistor chains of the NFET-PFET-NFET MOSFET type, so the first transistor chain, an NFET transistor chain, has a threshold voltage type of LVT, the second transistor chain, a PFET chain, has a "don't care" criteria, "k", or condition in that the threshold voltage transistor type can be LVT, SVT or HVT, and the third transistor chain, of an NFET type, is formed into a SVT threshold type. This is shown in Table 1, row 1 below as, for each value in a cell: NFET, PFET, NFET, LVT, *, SVT (where *=don't care condition i.e., the second transistor chain can be formed of LVT, SVT or HVT-type transistors). Other permutations may be as shown below for three transistor chains, including but not limited to these below combinations, with mirror images omitted (i.e. NFET, PFET, NFET, SVT, *, LVT is the mirror image of NFET, PFET, NFET, LVT, *, SVT and the former is not shown as it is redundant to the latter).

TABLE 1

| Chain 1 | Chain 2 | Chain 3 | Vt Chain 1 | Vt Chain 2 | Vt Chain 3 |
|---------|---------|---------|------------|------------|------------|
| NFET | PFET | NFET | LVT | * | SVT |
| NFET | PFET | NFET | SVT | * | HVT |
| NFET | PFET | NFET | LVT | * | HVT |
| PFET | NFET | PFET | LVT | * | SVT |
| PFET | NFET | PFET | SVT | * | HVT |
| PFET | NFET | PFET | LVT | * | HVT | where * = don't care condition, i.e., chain can be LVT, SVT or HVT-type transistors As can be seen from Table 1, the examples given therein show that when the first transistor chain is formed into devices selected from a first voltage threshold group consisting of LVT or SVT devices, the third transistor chain is selected from a slower switching, lower power consuming, second voltage threshold device group from the first voltage threshold group, this second group consisting of SVT or HVT devices that is different from the voltage threshold group of said first transistor chain or device. The difference is shown in the table so when the first group is an LVT device (or transistor chain made from LVT devices), the second group is an SVT or HVT device (transistor chain made from SVT or HVT transistors), while if the first group is an SVT device, the second group is an HVT device. In addition, it should be understood that symmetry exists so there is no loss of generality in going from right to left rather than left to right as discussed above, hence LVT-*-SVT is equivalent to SVT-*-LVT with no loss of generality, as one is merely switching the third transistor chain with the first transistor chain. In this way a designer using the present invention can combine the second transistor chain from the "don't care column", as shown in Table 1, with either the first chain or the third chain, as taught below, to realize a circuit that has different performance characteristics.

So it can be seen that the first and third chains of serially connected MOSFET transistors are NFET (or PFET) transistors, the second chain of serially connected MOSFET transistors are PFET (or NFET, if the first and third chains are PFET) transistors, and the first transistor chain is formed into devices that are selected from a first voltage threshold transistor group consisting of LVT, SVT and HVT transistors, with the third transistor chain is selected from a second voltage threshold group consisting of LVT, SVT and HVT transistors, wherein the third transistor chain is formed into a device from a voltage threshold group that is different from the voltage threshold group of the first transistor chain, e.g., if the first transistor chain is LVT, the third transistor chain can be SVT or HVT, while the middle transistor chain can be LVT, SVT or HVT.

By configuring a NFET-PFET-NFET transistor chains configuration that is formed into LVT-*-SVT type transistors, shown as LVT-LVT-SVT transistor chains in FIG. 1, it is possible to have maximum flexibility for a designer, being able to simultaneously realize either a fast Structured ASIC circuit that burns more power or a low power consuming Structured ASIC circuit that consumes less energy, at a cost of using some more chip area layout for the ASIC. For example, in the FIG. 1 embodiment, if a slow circuit design, or a relatively slow critical path is desired, the transistors of chains 17 and 19 would be connected via the connection fabric 21. This slow circuit would be slow but conserve power, consistent with the properties of SVT formed transistors. If a fast circuit design or fast critical path is desired, the transistors of chains 15 and 17 would be connected. By having PFET transistor chains 15 and 19 of opposite types, the VCLB architecture of the present invention can readily form either type of circuit (high-power, fast or low-power, slow) from a standard inventory of Structured ASIC cells incorporating the architecture of the present invention.

Figure 3:
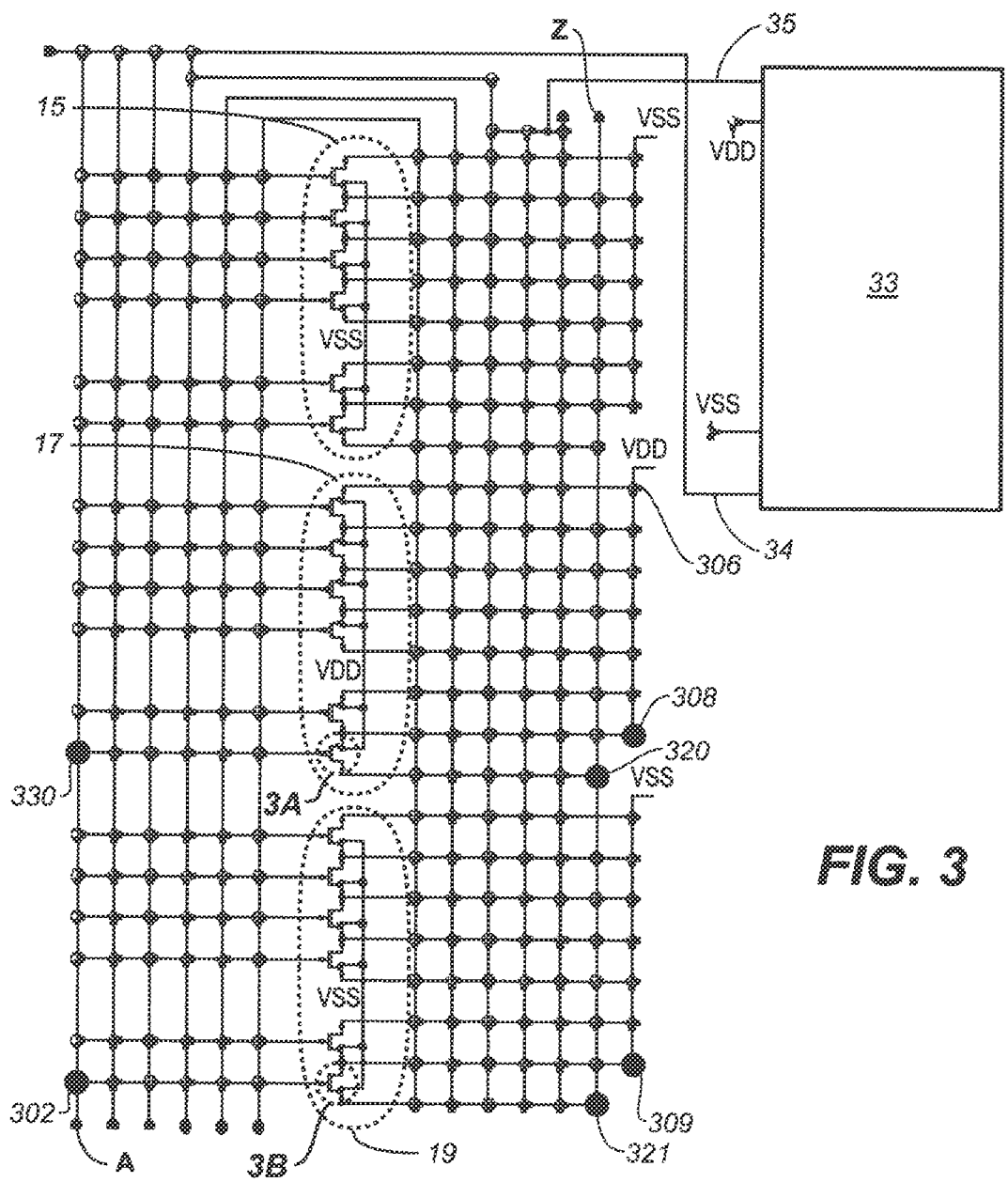
FIG. 3 is a schematic showing how the inverter of FIG. 2 may be constructed into a low-power, slow speed inverter using the embodiment of FIG. 1.
Figure 4:
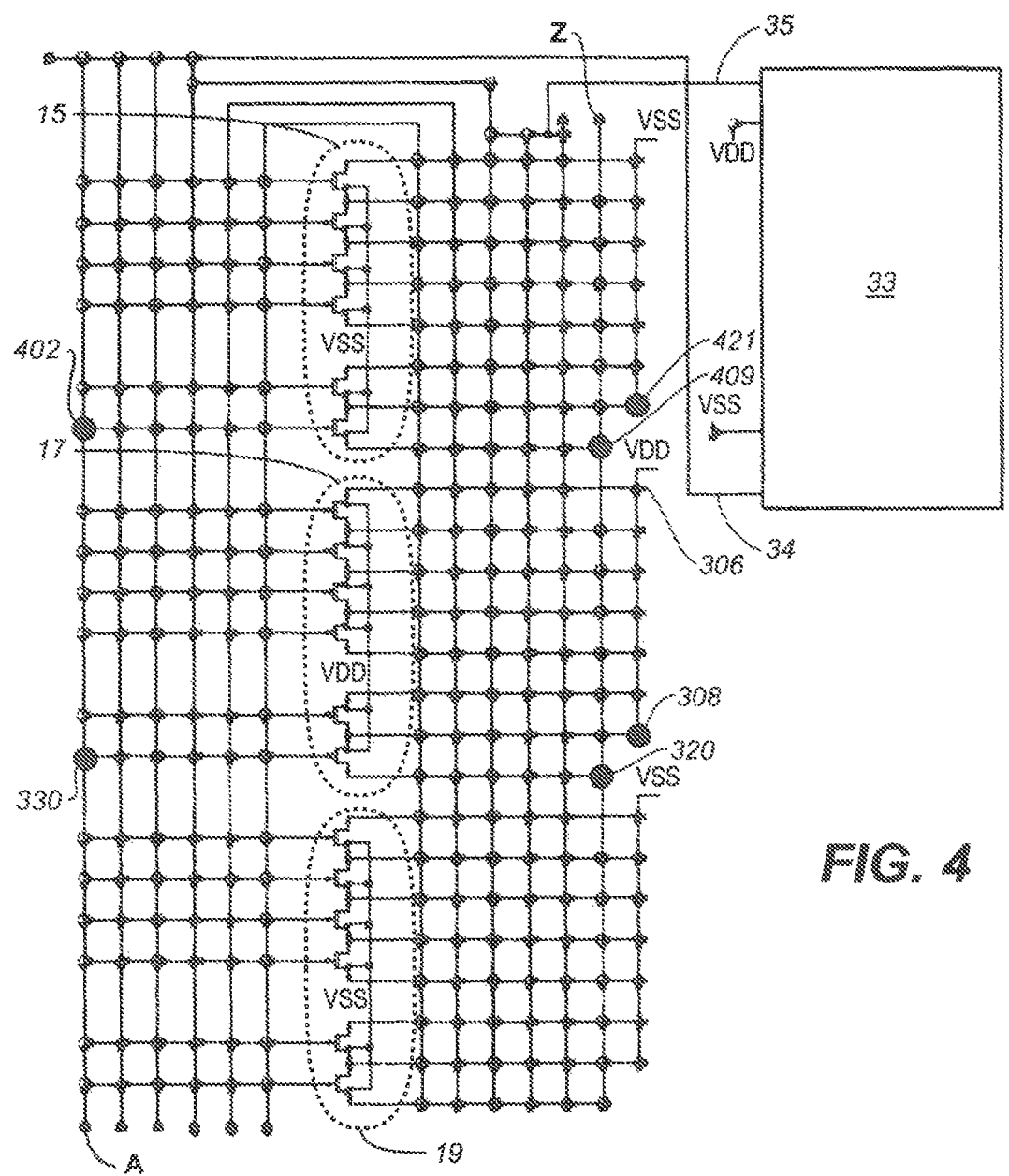
FIG. 4 is a schematic showing how the inverter of FIG. 2 may be constructed into a high-power, high speed inverter using the embodiment of FIG. 1.

As example of the faster/higher-power and slower/lower-power tradeoff that can be accommodated by the architecture of the present invention is shown in FIGS. 3 and 4, which implement the static CMOS inverter logic gate of FIG. 2. A simple inverter is shown for this example but in general any logic can be implemented, from a simple library function such as an inverter, NAND, latch and the like, to a complex macro.

FIG. 2 shows a schematic for an inverter 200 formed of CMOS logic, as is well known per se. An input signal "A" at signal line 202 is tied to the gates 204, 206 of two complementary transistors in a CMOS configuration, with the PFET transistor 208 at the top and the NFET transistor 210 at the bottom. Vdd is the power source line and Vss is the ground line, applied to the sources of the PFET 208 and NFET 210, while the drains of PFET 208 and NFET 210 go to the output of the inverter 200. An analysis of the circuit shows that this configuration will act as an inverter of the input signal, so that at the output 212, Z=A' (Z is the compliment of A).

Figure 3A:
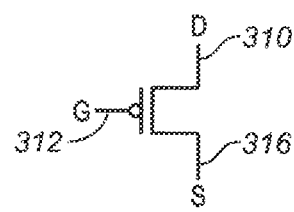
FIG. 3A is a schematic blow-up of a pMOS/PFET in FIG. 3.

Turning now to FIG. 3, there is shown a low-power, slower speed implementation of the inverter of FIG. 2, with the structure, except where the vias are connected or filled, otherwise the same as in FIG. 1. The same architecture of FIG. 1 is shown in FIG. 3, but with vias filled at certain interconnects to connect signal lines between metal layers and thus program functionality into the circuit. An input signal line at "A" represents the input signal A, and an output signal line at "Z" represents the output signal Z. At $V_{DD}$ 306 there is a via 308 that is filled to connect the Vdd power source line 306 with the source 310 of a PFET transistor having gate 312, as shown magnified in FIG. 3A, in the PFET transistor chain 17 that is formed into LVT type transistors. The drain 316 of the PFET transistor is connected with a filled via 320 to connect with the output signal line Z, the output. The input signal line A is connected to the gate of transistor 312 at filled via 330.

This completes half of the inverter design of FIG. 2. For the other half, the NFET transistors formed into SVT type transistors are used, at NFET transistor chain 19, since the inverter of FIG. 3 is intended to be a low power inverter. The ground line Vss is connected, through a filled via 309, to the source 340 of a NFET transistor having drain 346 and gate 342, as shown magnified in FIG. 3B. The drain 346 is connected to the output signal line Z, going to the output, at filled via 321. The gate 342 of the NFET transistor of NFET transistor chain 19 is tied to the control input signal line A through filled via 302.

Thus as can be seen the design of FIG. 3 serves as an inverter of the kind that uses LVT and SVT type transistors, which have the effect of consuming less power at the expense of being slower than a pure LVT type transistor configuration.

However, as showing in FIG. 4, using the geometry and architecture of FIG. 1 the same inverter can be designed into a fast switching, high-power inverter on the same pMOS-pMOS-nMOS VCLB/block element for a Structured ASIC using the transistors of LVT-type transistor chains 15, 17.

Turning now to FIG. 4, there is shown a high-power, fast speed implementation of the inverter of FIG. 2, with the structure in FIG. 4, except where the vias are connected or filled, otherwise the same as in FIG. 1. Again certain vias are filled at certain interconnects to connect signal lines between metal layers and thus program functionality into the circuit. An input signal line A provides for the input signal, and an output signal line Z provides for the output signal. At Vdd 306 there is a via 308 that is filled to connect the Vdd power source line 306 with the source 310 of a PFET transistor, like the PFET transistor in FIG. 3A, in the PFET transistor chain 17 that is formed into LVT type transistors. The drain 316 of the PFET transistor is connected with a filled via 320 to connect the PFET drain with the output signal line Z. The input signal line A, the input, is connected to the gate 312 of the PFET transistor at filled via 330.

Figure 3B:
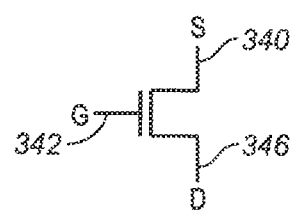
FIG. 3B is a schematic blow-up of a nMOS/NFET in FIG. 3.

For the other half of the circuit, the NFET transistors formed into LVT type transistors are used, from transistor chain 15, since the inverter of FIG. 3 is intended to be a high power consuming but high speed inverter. The drain 346 of the NFET is connected to the output signal line Z, at filled via 409. The ground line Vss is connected to the source 340 of a NFET transistor, as shown in FIG. 3B, through a filled via 421. The gate 342 of the NFET transistor is tied to the input signal line A, at filled via 402.

Even more generally, the relationship between the three transistor chains in terms of voltage threshold types may be shown as follows:

TABLE 2

| Chain 1 | Chain 2 | Chain 3 | Vt Chain 1 | Vt Chain 2 | Vt Chain 3 |
|---------|---------|---------|------------|------------|------------|
| NFET | PFET | NFET | Vt1 != Vt3 | * | Vt3 != Vt1 |
| PFET | NFET | PFET | Vt1 != Vt3 | * | Vt3 != Vt1 |

As before, in Table 2 above, the middle column, "*" is a "don't care condition" column but the difference is that the constraint on the first chain voltage threshold type is simply that it is not equal to (symbol: "!=") to the voltage threshold type of the third transistor chain, likewise, the third transistor chain is of a voltage threshold type that is not equal to the first transistor chain. This is true for both three transistor chains that are N-P-N as well as P-N-P. Hence, for this more general formulation of the three transistor chain architecture, the following permutations, inter alia, are allowed for a N-P-N configuration (or a P-N-P configuration): HVT-*-LVT, SVT-*-HVT, LVT-*-SVT.

Though in a preferred embodiment three chain islands are shown at 15, 17 and 19, in general we can have more chain islands, such as chain 20. If chains 15, 17 and 19 are nFET, pFET and nFET, respectively, then chain 20 would be a pFET chain, for ease in manufacturing. In general this relationship on alternating P and N type transistors is observed in CMOS manufacturing.

In the most general case, the voltage threshold groups for four transistor chains would be constructed according to the following constraint: the first chain will not be of the same voltage threshold type as the third chain, and the second chain will not be of the same voltage threshold type as the fourth chain.

This relationship is as found in the following table,

TABLE 3

| Chain 1 | Chain 2 | Chain 3 | Chain 4 | Vt Chain 1 (Vt1) | Vt Chain 2 (Vt2) | Vt Ch. 3 (Vt3) | Vt. Ch. 4 (Vt4) |
|---|---|---|---|---|---|---|---|
| NFET | PFET | NFET | PFET | Vt1 != Vt3 | Vt2 != Vt4 | Vt3 != Vt1 | Vt4 != Vt2 |
| PFET | NFET | PFET | NFET | Vt1 != Vt3 | Vt2 != Vt4 | Vt3 != Vt1 | Vt4 != Vt2 |

Explanation of Table 3 is similar to the explanation of Table 2 and is as follows. the voltage threshold group types of the first chain is not the same as the third chain, and vice versa, and the voltage threshold type of the second chain is not the same as the voltage threshold type of the fourth chain, and vice versa. This is true for N-P-N-P and P-N-P-N type chains. Hence, for this general formulation of the four transistor chain architecture, the following permutations, inter alia, are allowed for a N-P-N-P configuration (or a P-N-P-N configuration): HVT-LVT-SVT-HVT, LVT-SVT-SVT-HVT, SVT-LVT-LVT-HVT.

Insofar as MOSFET types go, the islands are constructed in the present invention according to the fact that nFETs and pFETS alternate, so that the first and third chain islands are of the same type of MOSFET transistor (i.e. both pMOS or nMOS) and the second and fourth chain islands are of the same type of MOSFET transistor (i.e. both nMOS or pMOS), with the first and third MOSFET types differing from the second and fourth MOSFET types. In this way one will get an alternating type of MOSFET in neighboring MOSFETs according to a P-N-P-N configuration or N-P-N-P configuration, that is, the neighboring transistors are of different types.

Turning now to another aspect of the present invention, it is disclosed how the three transistor chains can have their drive strength varied to achieve faster logic gate switching (at a cost that the transistor chain with a higher drive strength will consume more power and take up more die area with a higher drive strength). The cost of a higher drive strength is that these transistor chains and the logic made from the chains that have a higher drive strength will consume more power and take up more chip area. The higher drive strength can be any multiple of 1×, that is 2×, 3×, 4× and so on, or any rational number, such as 0.5×, 1.0×, 1.3×, 2.5×, and so on, depending on the W/L (transistor gate width divided by transistor gate length) ratios chosen for the transistors, as is known per se in the art. In practice gate length is not varied much but kept as small as possible while gate width, W, is varied to change the drive strength. Drive strength can be any rational number, A, such as A=2.5.

FIGS. 5A, 5B and 5C show configurations of simple logic gates showing an inverter (FIG. 5A), a two-input NAND gate (FIG. 5B), and a two-input NOR gate (FIG. 5C), all of which form prior art. Various prior art techniques of modeling delay and avoiding delay in a logic gate have been explored and implemented, and it has been found that delay is produced by a plurality of variables, sometimes classified as variable delay and fixed (parasitic) delay. Variable delay is further classified, as the product of logical effort and fixed effort. Logical effort relates to properties of the logic gate topology; for example, reduced output current by a logic gate generally means slower operation. Electrical effort relates to the electrical environment of the logic gate as well as the size of the gate transistors, and is sometimes called "fanout" by CMOS designers, and relates to load capacitance, not just the number of gates being driven. In an effort to minimize variable delay in logic gates, in particular electrical effort, it has been found that increasing the size of the transistors in the gate of CMOS transistors will decrease the variable delay.

One of the simplest logic gate for a relative minimum of variable delay is the inverter of FIG. 5A. Supposing that this inverter logic gate has a certain performance level, as measured by output current, then the other logic gates can have the same performance level if their transistor drive strengths are varied as shown. This is important in order so that none of the remaining logic gates in a circuit become bottlenecks. It can be shown by simulation using a simulator such as SPICE (Simulation Program with Integrated Circuit Emphasis), or any other simulator, that by varying the drive strengths of the logic gates of the NAND of FIG. 5(b) and the NOR of FIG. 5(c), with the transistor drive strengths given by the indicia shown (such as "2", "2" in FIG. 5(b) and "1", "4" in FIG. 5(c), at the gates of the CMOS transistors), that the three logic gate circuits of FIGS. 5A, 5B and 5C are roughly equivalent for delay purposes. This demonstrates one purpose behind varying the drive strengths of transistor gates forming logic gates.

Thus turning attention now to the present invention as shown in FIG. 6, there is shown a three island transistor analogous to FIG. 1, showing six transistor chains 602, 604, 606, 608, 610, 612. As before, in connection with the previous embodiments of the present invention shown in FIGS. 1-4, all sources/drains/gates of the transistors in the chains may generally be connected to a via-configurable routing fabric, shown as fabric 21, with the fabric comprised of the intersection of routing signal lines such as vertical lines 23 and horizontal lines 25 that are connected by vias shown as circles at the intersection of vertical lines 23 and horizontal lines 25. This fabric that connects transistors and groups of transistors to one another for ease in terminology are called via-configurable interconnections. A predetermined number of these vias are filled to connect certain transistors to one another, to program, configure and customize an ASIC incorporating the fabric, depending on the design functionality requested by the ASIC designer.

Figure 6A:
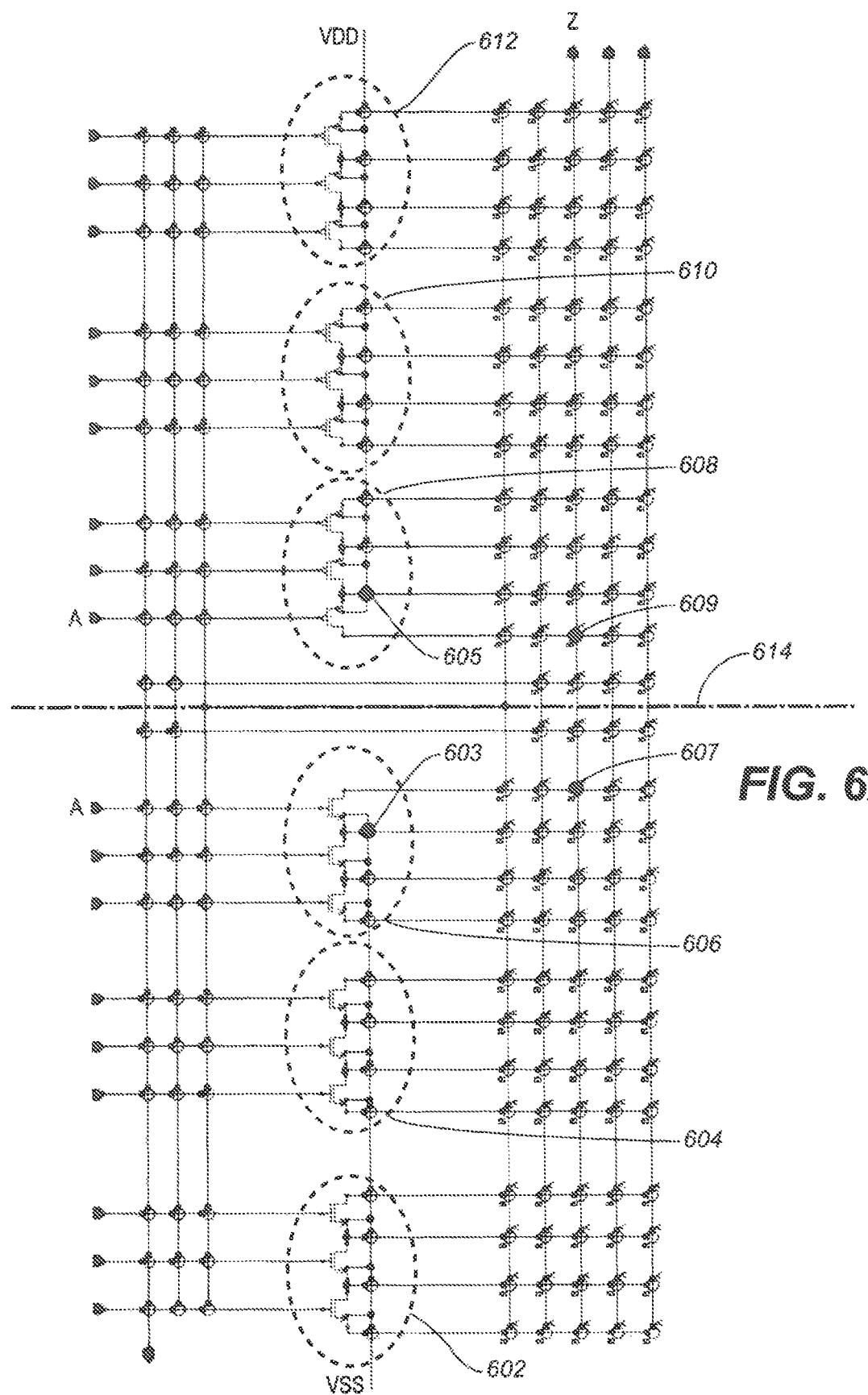
FIGS. 6A, 6B and 6C are schematic of using drive strength in another embodiment of the invention to construct simple logic gates comprising an inverter, two-input NAND gate and two-input NOR gate.
Figure 6B:
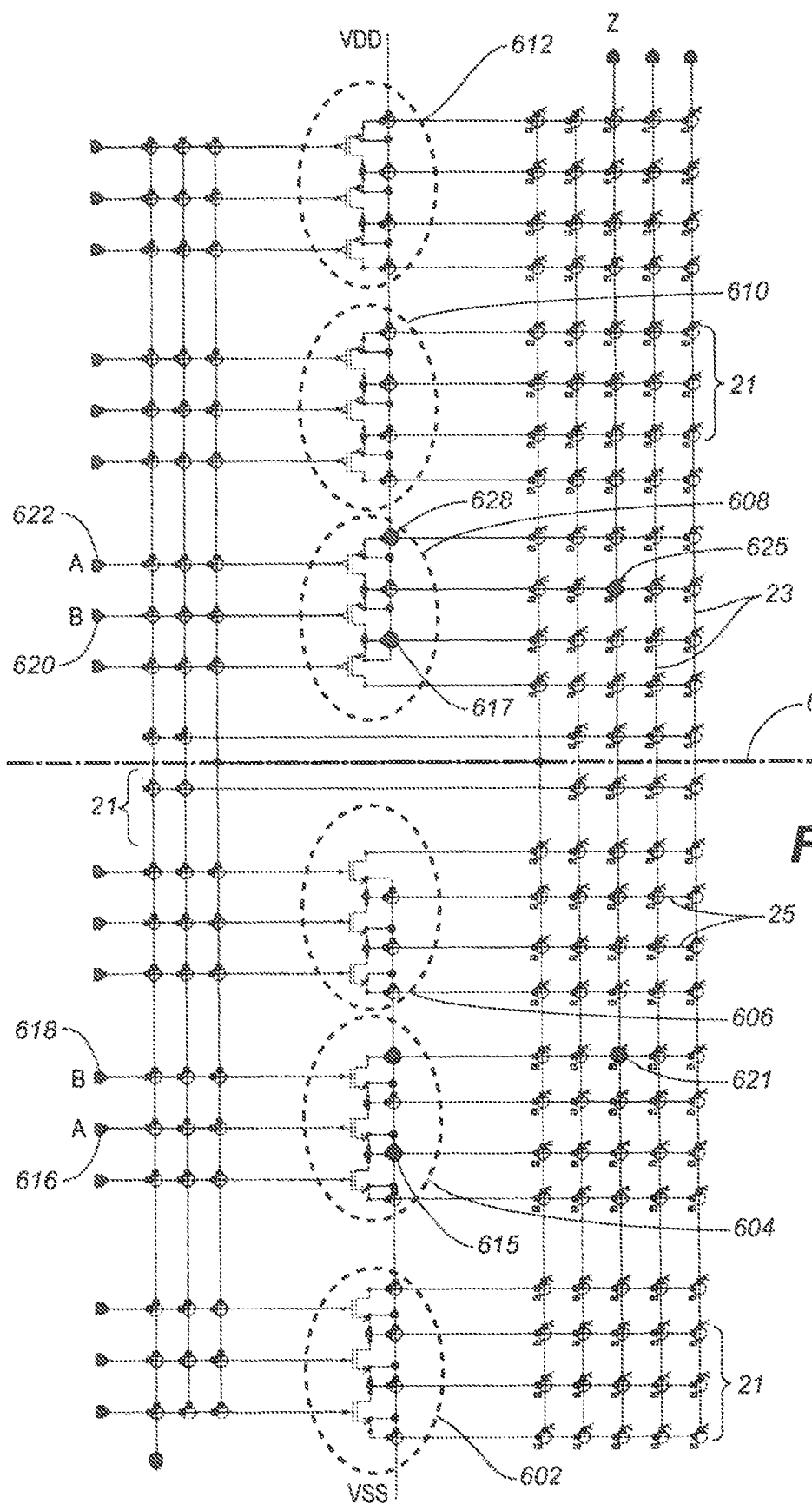
Figure 6C:
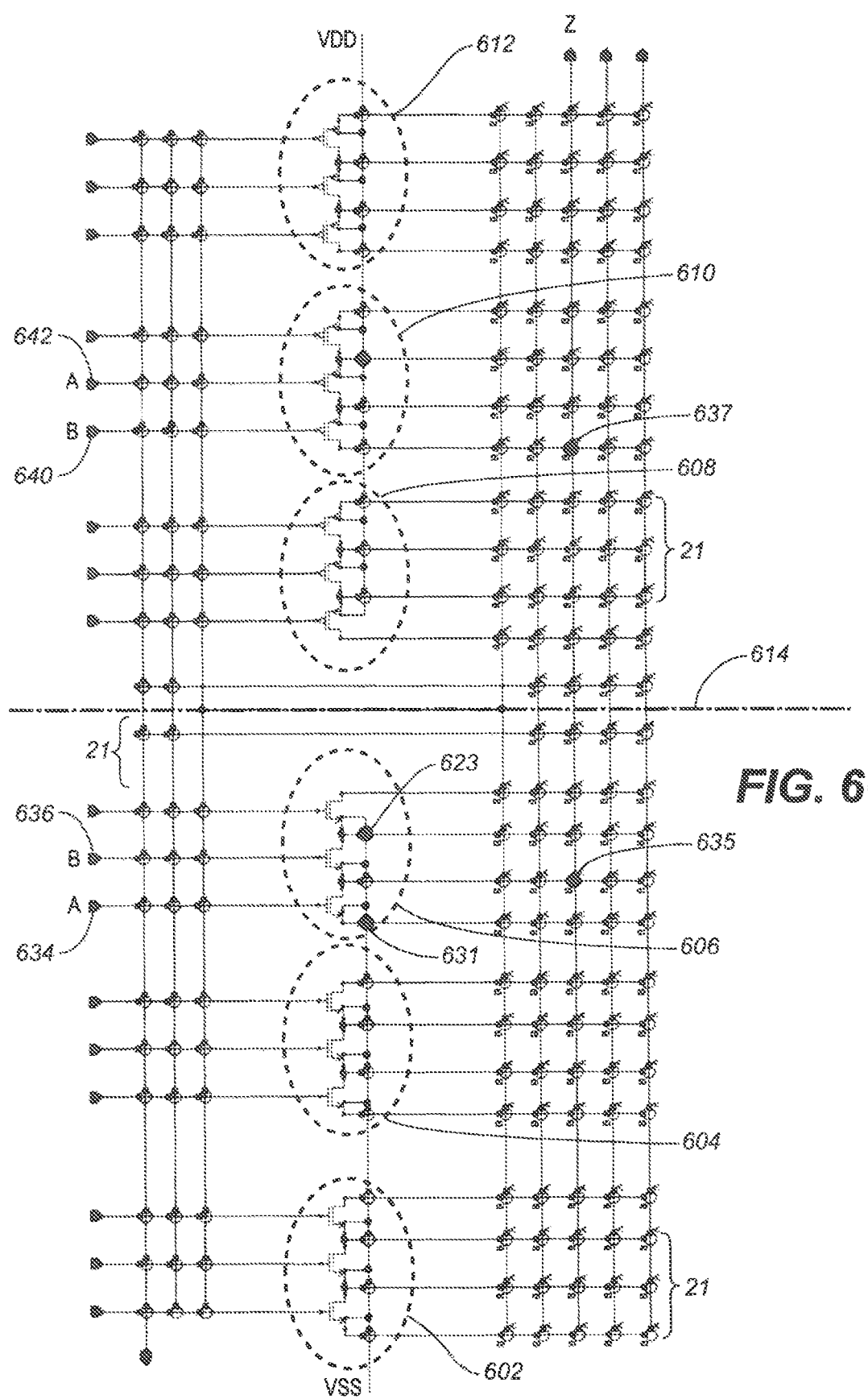

The PFET/pMOS and NFET/nMOS configuration for the CMOS circuitry of FIGS. 6A-6C are that the three islands 602, 604 and 606 to the left of bisecting line 614 when the drawing is viewed in landscape mode are NFET/nMOS transistors, while the three islands 608, 610 and 612 to the right of the bisecting line 614 are PFET/pMOS transistors.

The six transistor chains have a plurality of transistor drive strengths, in one preferred embodiment paired in groups of three, with the following pairs of chains having the same drive strengths: chains 606 and 608; chains 604 and 610; and chains 602 and 612. Hence a designer can mix and match transistors of various drive strengths to design a circuit.

Hence, for one example, the transistor drive strengths of transistor chains 606 and 608 can be 1.0×, and the drive strengths of chains 604 and 610 can be 2.0× (twice that of chains 606, 608), while the drive strengths of 602 and 612 can be 4.0× (four times the drive strength of chains 606, 608, and twice the drive strength of chains 604, 610). Other rational numbers for transistor drive strengths may be employed. Increased drive strength will consume more power in the transistors but speed up the logic gate switching.

Transistors may be mixed and matched for transistor drive chains in a plurality of manners, as can be appreciated by one of ordinary skill in the art from the teachings herein. Thus transistors can be picked from either side of the imaginary dividing line 614 to form a circuit, the line 614 bisects the six-transistor structure of FIG. 6 about the midpoint of the structure and about which the structure is symmetrical in properties, hence the same transistor chains share the same properties depending on how far away (i.e., their position from) the transistor chains are from the imaginary dividing line 614.

Hence, suppose a designer wants to construct any logic circuit, such as the simple gates shown in FIGS. 6A, 6B and 6C, so they have roughly the same delay, as do the circuits of FIGS. 5A-5C. This can be done using the architecture of FIGS. 6A-6C of the present invention. Thus, turning to FIG. 6A, there is shown how to build an inverter having a baseline delay. By inspection, and from a circuit simulation, it can be shown that connecting (filling) the vias at points 603, 605, which are the drain or source, depending on whether a P-type MOSFET or N-type MOSFET transistor is present in the first transistors closest to the dashed midpoint symmetrical line 614, and filling the vias 607, 609, which lead to output line labeled "Z" (611), will give the inverse of a signal supplied to an input, such as either one of the inputs "A" (613) or "A'" (613') (the two input signals A are the same signal, analogous to what is shown in FIG. 5A) to the inverter logic gate.

Now suppose the designer wanted to achieve roughly the same delay as in the inverter of FIG. 6A in another logic gate circuit comprising a NAND gate, shown in FIG. 6B. Using the architecture of the present invention, this can be readily done. By inspection, and from a circuit simulation, it can be shown that using the transistors from island chain 604 and 608 will give a NAND logic gate circuit equivalent to the circuit in FIG. 5B. Thus connecting (filling) the vias at select points will give an equivalent circuit that has a delay roughly the same delay as the inverter of FIG. 6A. This is done by selective filling of vias to construct an equivalent NAND circuit having equivalent delay to the inverter through the use of transistor drive strength. One via filled is at point 615 for a transistor source which connects to Vss (ground), of the transistor of N-type MOSFET chain island group 604 connected at its gate to input signal line 616, which is connected to the input "A" of the NAND gate. The three transistors in chain island group 604 are connected sequentially to one another as before. Another via filled is at point 621, which connects the drain of the transistor of chain island group 604 that has its gate connected to input signal line 618, which connects to the input "B" of the NAND gate. It is understood that inputs A, B of the NAND gate give an output Z as determined by the well-known truth table for NAND gates. Chain island group 604 is of transistor drive strength 2×.

Moving to the P-type MOSFET side of FIG. 6B, these same inputs A, B are shown connected to signal lines 620, 622 (with line 620 for input B and line 622 for input A) which lead to two transistors of three transistor chain island group 608, the three transistors connected serially, and which are of 1× transistor strength. The two transistors are connected sequentially to one another by nature of being part of chain 608. As shown in FIG. 6B, there are two vias 617, 628 filled, which connect the source/drain of the two pMOS transistors in transistor chain island group 608, which are connected to Vdd (Power), and, through the filling of via 625, and vias 615 in transistor chain island group 604, connected to filled via 621, which in turn with the other lines are connected to output "Z", to give the output for a NAND gate as is known per se by the well-known truth table for NAND gates, when A and B are inputs. Thus a designer of the FIG. 6B NAND gate has achieved the equivalent circuit to FIG. 5B, and consequentially has matched the delay of the FIG. 6A inverter.

Similarly, if the designer wanted to achieve roughly the same delay as in the inverter of FIG. 6A in another logic gate circuit comprising a NOR gate, the designer would use the configuration shown in FIG. 6C, which is analogous to FIG. 5C in principle, as provided by the architecture of the present invention. By inspection, and from a circuit simulation, it can be shown that using the transistors from island chain 606 (nMOS transistors of drive strength 1×) and island chain 610 (pMOS transistors of drive strength 2×) will give the equivalent circuit that has roughly the same delay as the inverter of FIG. 6A. Thus NOR inputs A, B are connected to lines 634, 636 respectively, and lead to gates of two transistors in three transistor chain island group 606. Vias 631, 623 are filled which connect the source of the two transistors in the three transistor chain island 606 to Vss (ground), and another via 635 is filled to connect the two transistor outputs to the output line Z. On the pMOS side of the CMOS circuit, there are two inputs A, B, which are the same signals of A, B as before, tied to the signal lines 640 (tied to input signal B) and 642 (tied to input signal A), which led to the gates of two pFET transistors as shown having their source/drain output connected by a filled via 639 to the Vdd (power) line. In turn this output signal is tied to the output line "Z" by filling a via 637, to give the output for a NOR gate as is known by the well-known truth table for NOR gates, when A and B are inputs.

Likewise, the third chain island groups of 602, 612 can be used by a skilled designer for increased drive strength using the teachings of the present invention. Any number of combinations may be employed using the teachings herein.

Though a pair of three transistor chains islands are shown in FIG. 6, any number greater or less than three transistor chains may be employed, and more than a pair of such chains (symmetrical about an imaginary dividing line 614) may be employed using the teachings of the present invention. Further, in 28 nm node technology, it has been found in practice that the relative differences in transistor strength ratios decrease more to a ratio of 1.5 to 1 rather than a larger ratio as suggested by the prior art of FIG. 5.

Figure 7:
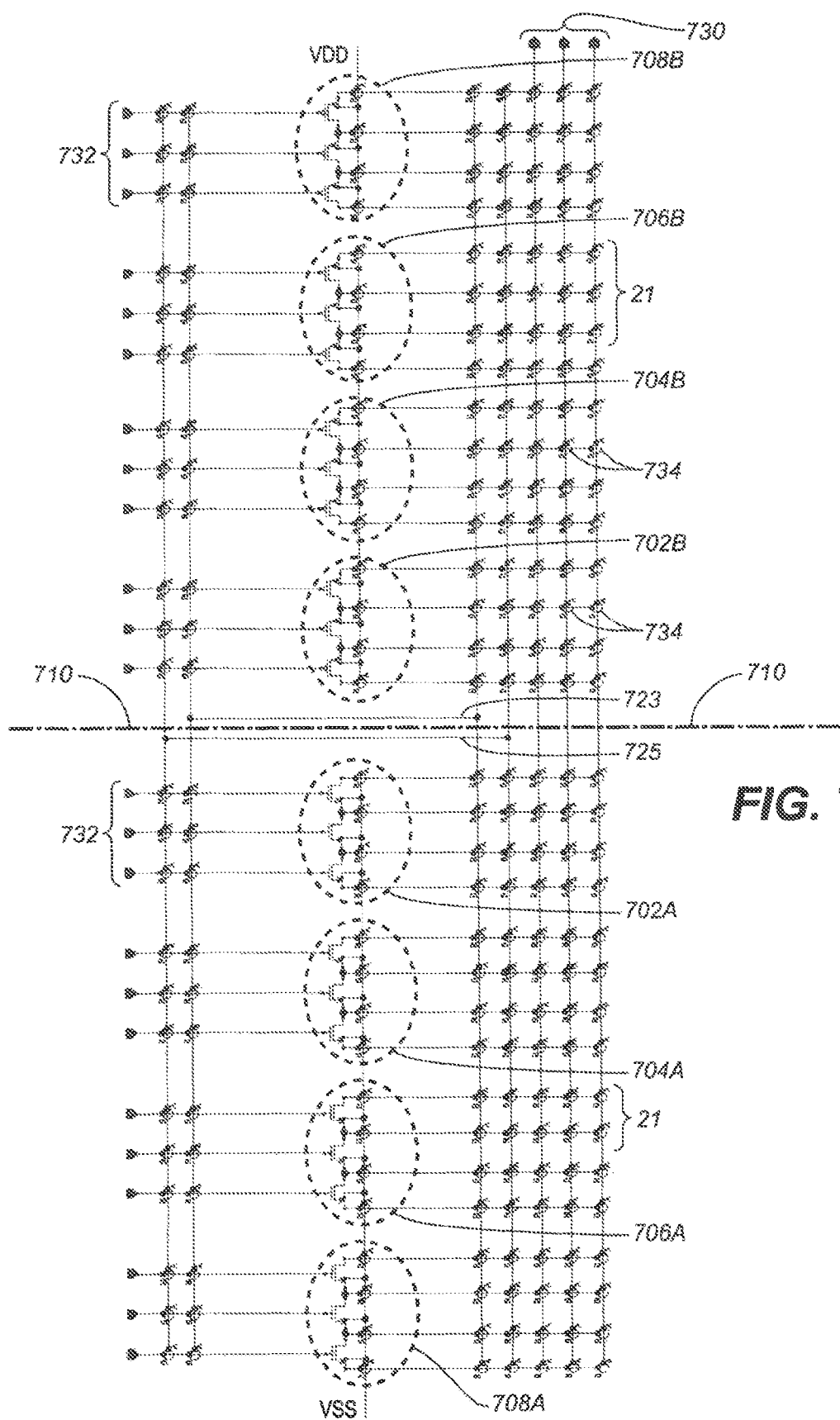
FIG. 7 is a schematic of yet another embodiment of the invention that combines voltage threshold and drive strength concepts into a single design architecture.

Thus turning attention now to the present invention as shown in FIG. 7, there is a schematic of yet another embodiment of the invention that combines voltage threshold and drive strength concepts. A pair of 4-transistor islands are shown, analogous the previous embodiments, showing eight transistor chains divided and symmetrical about a center line 710. These transistors are, as indicated from their distance from the center line 710: 702A, 702B, 704A, 704B, 706A, 706B, 708A, 708B, with the "A" designated transistors being pMOSFET transistors and the "B" designated transistors being nMOSFET transistors. As before, in connection with the previous embodiments of the present invention shown in FIGS. 1, 3, 4, 6A-C, all sources/drains/gates of the transistors in the chains may generally be connected to a via-configurable routing fabric, shown as fabric 21, with the fabric comprised of the intersection of routing signal lines such as the vertical lines and horizontal lines that are connected by vias shown as circles at the intersection of vertical and horizontal lines. This fabric that connects transistors and groups of transistors to one another for ease in terminology are called via-configurable interconnections. A predetermined number of these vias are filled to connect certain transistors to one another, to program, configure and customize an ASIC incorporating the fabric, depending on the design functionality requested by the ASIC designer. Lines 723, 725 provide feedback from the output in order to preserve state information when forming circuits requiring preservation of state information, such as sequential circuits that require some kind of memory or latch, but otherwise the embodiment of FIG. 7 is as shown before in connection with FIGS. 1, 3, 4, 6A-C, which also may incorporate feedback as shown here, to preserve state information. Multiple outputs 730 and multiple inputs 732 are provided in the architecture of FIG. 7 to give a designer maximum flexibility when designing circuits, which can gave a "low power"/"low performance" and "high power"/"high performance" circuit exist side by side on the same FIG. 7 layout, and not interfere with each other as multiple inputs and outputs are provided, if vias such as vias 734 are judiciously closed. Thus with three outputs 730 up to three logic functions (e.g. inverter, NAND, NOR) may be deployed, and in general by extending the fabric 21 to have more rows as shown, one can have any number of outputs and inputs.

The FIG. 7 embodiment can be made into various configurations where both voltage thresholds and transistor drive strengths are utilized.

One example configuration, the high power, highest performance option, emphasizes maximum speed at the expense of higher power consumption: transistors 702A and 702B may be 1× transistor drive strength, while 704A, 704B are 2× transistor drive strength, and while 702A, 702B, 704A, 704B are made into LVT transistors. The presence of two different drive strengths (which in general may be X drive strength and Y drive strength, with X,Y being rational numbers) gives good designer flexibility and maximum performance when optimizing a netlist when designing circuits using this configuration.

As another example, the reduced power, medium performance option, the two outer transistor chains, 706A and 708A and 706B and 708B, would be made into SVT transistors, while transistor chains 702A, 702B, 704A, 704B are made into LVT transistors. In terms of drive strength, the drive strength of transistor chains 702A and 706A would be the same, as some rational number X, while both transistor chains 704A and 708A would be a rational number Y (Y greater than X, and in general different from X). Likewise transistor chains 702B and 706B would be some drive strength X and transistor chains 704B and 708B would be some drive strength Y. The criteria of whether to use the slower, less power consumptive SVT transistors versus the faster, more power consumptive LVT transistors in this example depends on whether the circuit being built is on the 'critical path' of a netlist or not. The critical path is the where the bottleneck can potentially occur, and requires the fastest (i.e. LVT) transistors. Circuits that are off the critical path can use the slower, less power hungry SVT transistors. Hence, by way of example, a primitive logic function such as an inverter, NAND, NOR can be constructed with either the fast LVT or slower SVT transistors, in this reduced power, medium performance option configuration example. Using the multiple outputs and inputs 730, 732 both a "low power"/"low performance" and "high power"/"high performance" circuit can be deployed on the same FIG. 7 layout, and with three outputs shown up to three such circuits may be deployed simultaneously.

In general then, for the FIG. 7 embodiment one would pick a pair of MOSFET transistors from a plurality of transistor chain islands of serially connected MOSFET transistors that are symmetrical about an imaginary center dividing line, such as center line 710, with one group of MOSFET transistor chains on one side of the line 710 being nFET (e.g., transistor chains 702A, 704A, 706A, 708A) and the other group of MOSFET transistor chains being pFET (e.g., transistor chains 702B, 704B, 706B, 708B). The voltage thresholds of each group of nFET and pFET transistor chains may be changed in a symmetrical fashion about the center line 710, so that for example transistor chains three chains away from the center line 710 may be formed of HVT transistors (e.g. transistor chains 708A, 708B, being comprised of nFET and pFET transistors, respectively); another group of transistor chains, such as transistor chains 704A, 706A and 704B, 706B may be nFET and pFET transistors, respectively, and formed of SVT type transistors; while a third group of transistor chains, such as transistor chains 702A, 702B are formed of LVT type transistors as voltage thresholds.

Hence in FIG. 7 there is disclosed a first nFET transistor chain island of serially connected nMOSFET transistors (e.g. chain 702A), a second nFET transistor chain island of serially connected nMOSFET transistors (e.g. chain 704A), a first pFET transistor chain island of serially connected pMOSFET transistors (e.g. chain 702B) and a second pFET transistor chain island of serially connected pMOSFET transistors (e.g. chain 704B), with the first nFET chain island, the second nFET chain island, the first pFET chain island and the second pFET chain island forming a symmetrical structure about the imaginary line 710 bisecting the chain islands, with the first and second nFET transistor chains on one side of the bisecting imaginary line 710 and the first and second pFET transistor chains on the other side of the bisecting imaginary line. The number of nFET/pFET transistor chains can be generalized to include more than first and second chains, to any number of chains. Further, as explained herein, at least one of the pFET chain islands (i.e. 702A, 704A, 706A, 708A) and at least one of said nFET chain islands (i.e. 702B, 704B, 706B, 708B) are formed from devices having voltage thresholds selected from a voltage threshold group consisting of LVT, SVT and HVT devices. Likewise when discussing transistor drive strength properties, there can be pairs of equivalent transistor chains (designated by "A" or "B" at the suffix, e.g. 702A and 702B are equivalent transistor pairs for drive strength), so that a first pair of equivalent transistor chains are selected from at least one set of transistor chains from the nFET chain island side of the bisecting imaginary line 710, and the other set (forming the pair) from the pFET chain island side of the line 710, with this first pair of equivalent transistor chains having substantially the same predetermined drive strength of X, where X=a rational number. The set of transistor chains that have the same drive strength X can be one, two or more transistor chains, as disclosed herein. Then a second pair of equivalent transistor chains are selected from at least one set of transistor chains from the nFET chain side of said of the bisecting imaginary line 710, and the other set (forming the pair) from the pFET chain island side of the line 710, with this second pair of equivalent transistor chains having substantially the same predetermined drive strength of Y, where Y=a rational number, Y not equal to X. Again, the set of transistor chains that have the same drive strength Y can be one, two or more transistor chains, as disclosed herein.

Note the symmetry in these relationships about the center line dividing the nFET and pFET transistor chains from one another, and which offer the possibility of different voltage drive strengths for the transistor chains despite being from different voltage threshold groups of transistor chains. Hence, in this hypothetical combination, the pair of transistor chains 702A and 706A can have the same drive strength X (with X some rational number) despite being of LVT voltage threshold type for transistor chain 702A and SVT voltage threshold type for transistor chain 706A, while both transistor chains 704A and 708A would have the same drive strength Y, a rational number Y (Y in general different from X), despite transistor chain 704A being SVT-type voltage threshold transistors and 708A being an HVT-type voltage threshold transistor. Likewise transistor chains from the pFET side of the dividing line 710 would match this symmetry of this example, and form equivalent transistor chains to their analogs on the opposite side of dividing line 710, with transistor chains 702B comprised of LVT-type voltage threshold transistors, transistor chains 704B, 706B comprised of SVT-type voltage threshold transistors, and transistor chain 708B formed of HVT-type voltage threshold transistors, all of the pMOSFET type. The transistor drive strength would match the symmetry of the transistors on the opposite side of the dividing line 710, forming equivalent transistor chains with their analog found across the dividing line. Thus in this example transistor chains 702B and 706B can have the same drive strength X (with X some rational number) while both transistor chains 704B and 708B would have the same drive strength Y, a rational number Y (Y in general different from X), and as can be appreciated from the teachings herein 702A, 704A, 706A, 708A and 702B, 704B, 706B, 708B are symmetrical analogs with one another in properties, either voltage threshold or drive strength. In general, regarding drive strength, there can be any number of LVT, SVT, HVT transistor chains and in any combination (all LVT, SVT, HVT, or LVT, SVT only, or LVT, HVT only, or SVT, HVT only, or LVT, HVT and the like, in general for three types of voltage thresholds, nine such combinations of voltage thresholds type transistor chains are possible). Likewise voltage drive strength may be varied for any combination of transistor chains (including those not even in the same voltage threshold group, as explained above) with the only constraint that for optimal ease in design there should be symmetry of both voltage thresholds and transistor drive strengths between the two groups of nMOSFET and pMOSFET transistor chains lying on opposite sides of a symmetrical line dividing them, such as center line 710, thus forming equivalent transistor chains. Hence, the nFET and pFET transistor chains are symmetrical in properties (the properties being voltage threshold or drive strength) about the imaginary bisecting line 710, and the same transistor chains share the same properties depending on how far away (i.e., their position from) the transistor chains are from the imaginary dividing line 710. Hence transistor chains 702A, 704A, 706A, 708A and 702B, 704B, 706B, 708B are symmetrical analogs about line 710 with one another in properties, either voltage threshold or drive strength; e.g. chains 702A and 702B can be both LVT voltage threshold group devices, and chains 702A, 706A can be of the same drive strength as 702B, 706B, as explained herein.

The logic of FIG. 7 would appear as a cell of a Structured ASIC, such as one of the sixteen cells that in groups of four constitute, along with full adders, an "eMotif" cell as termed by assignee to the present invention, with, in one preferred configuration, two of the FIG. 7 layouts appearing in each of the eMotif cells, operatively connected to a full adder. In general however the present invention may be employed in any semiconductor device, and not just only a Structured ASIC.

The method of making and using the apparatus of all the embodiments of the present invention is to design a Structured ASIC to form the structured ASIC using the traditional ASIC design flow as taught herein, but with the architecture of the via-configurable high-performance logic block involving three transistor chains, having a plurality of NFET and PFET transistors in a transistor chain as taught herein, with NFET and PFET transistor chains alternating side by side as is most efficient for MOSFET IC manufacturing, as shown in the figures, e.g. groups 15, 17, 19 or 15, 17, 19 and 20 in FIG. 1, or in groups of pFET or nFET transistors in transistor island chains as in chain groups 602, 604, 606 and chain groups 608, 610, 612 in FIG. 6.

Regarding the voltage threshold aspect of the present invention, the voltage threshold type is then manufactured for these chains of transistors in various combinations for the Structured ASIC as taught by Tables 1, 2 and/or 3. The Structured ASIC can have any number or all of the permutations shown in Tables 1, 2 or 3. The via-configurable routing fabric is then connected to the NFET and PFET transistors, and suitable power, ground and control circuitry deployed to form a cell that may be customized by filling in the via connection layers, either a single via connection layer that may be customized either with lithographic or maskless techniques, or with multiple via-configurable layers. The customization or programming of the Structured ASIC is done after an inventory of non-customized Structured ASIC chips are manufactured and stored in inventory. Thus the method of forming the claimed invention does not have to occur all at once at one foundry, but can be spread out over several stages and over a longer period of time, using inventory of Structured ASIC chips from which designs may be finalized, as can be appreciated by one of ordinary skill in the art from the teachings herein. Thus in this way a large run of non-customized Structured ASICs may be manufactured, then customized in a single via connection layer, see by way of example and not limitation U.S. Pat. No. 6,953,956, issued to eASIC Corporation on Oct. 11, 2005; U.S. Pat. No. 6,476,493, issued to eASIC Corporation on Nov. 5, 2002; and U.S. Pat. No. 6,331,733, issued to eASIC Corporation on Dec. 18, 2001; all incorporated herein by reference in their entirety. Any other suitable form of mechanically connecting the NFET and PFET transistors may be used. The threshold voltages type transistors are formed consistent with Table 1 for the inventory of Structured ASICs, and these Structured ASICs are stored in inventory. When a customer wants to design a circuit using these Structured ASICs, the Structured ASICs are mask-programmed using a single via layer and the design is completed.

The via-configurable Structured ASIC of the present invention may be manufactured on any process node size, but preferably on a 22 or 20 nm CMOS process lithographic node and having feature sizes of this dimension or less. The present invention can be manufactured on a 2.5D IC/SiP rather than a traditional 2D IC/SiP. The present invention may also be manufactured with a 3D IC/SiP configuration. As can be appreciated by one of ordinary skill from the teachings herein, the layout of the pFET and nFET transistors can be different from the flat layout as shown in the drawings; by way of example, looking at FIG. 7 it may well be that the nMOSFET transistors below dividing line 710 may lie in a plane or layer on top of the plane or layer holding the pMOSFET transistors found above dividing line 710 in an actual layout, without loss of generality from the architecture shown in FIG. 7, though in a preferred embodiment in fact the layout of nMOSFET and pMOSFET are coplanar. Hence when using the term "neighboring" when describing nFET and pFET transistor chains it does not exclude nFET and pFET transistor chains that are not coplanar and are on different layers but in close proximity to each other.

Modifications, subtractions and/or additions can be applied by one of ordinary skill from the teachings herein without departing from the scope of the present invention. For example while in the preferred embodiment there was language referring to three transistor chains, any number of chains can be used according to the teachings of the invention. Thus the scope of the invention is limited solely by the claims.

It is intended that the scope of the present invention extends to all such modifications and/or additions and that the scope of the present invention is limited solely by the claims set forth below.

We claim:

1. A semiconductor device for an ASIC, comprising:
a first chain island of serially connected MOSFET transistors;
a second chain island of serially connected MOSFET transistors;
a third chain island of serially connected MOSFET transistors;
via-configurable interconnections among the three chain islands of transistors; wherein, said ASIC is configured through said via-configurable interconnections;
wherein said second chain island is in-between said first and third chain islands, said first and third chain islands are of the same type of MOSFET transistor, and said second chain island is of a different type of MOSFET transistor from the first and third chain islands; and
wherein said first and third chain islands are comprised of a voltage threshold type, said first and third chains having a different voltage threshold type from one another.

2. The semiconductor device according to claim 1, wherein said first and third chain islands of serially connected MOSFET transistors are NFET transistors, and said second chain island of serially connected MOSFET transistors are PFET transistors.

3. A semiconductor device for an ASIC, comprising:
a first chain island of serially connected MOSFET transistors;
a second chain island of serially connected MOSFET transistors;
a third chain island of serially connected MOSFET transistors;
via-configurable interconnections among the three chain islands of transistors; wherein, said ASIC is configured through said via-configurable interconnections;
wherein said first and third chain islands of serially connected MOSFET transistors are PFET transistors, and said second chain island of serially connected MOSFET transistors are NFET transistors.

4. The semiconductor device according to claim 1, wherein:
and said first transistor chain island is formed into devices that are selected from a first voltage threshold group consisting of LVT, SVT and HVT devices, and said third transistor chain island is selected from a second voltage threshold group consisting of LVT, SVT and HVT devices, wherein said third transistor chain island is formed into a device from a voltage threshold group that is different from the voltage threshold group of said first transistor chain island.

5. The semiconductor device according to claim 1:
a fourth transistor chain island next to said third chain island and comprised of MOSFET transistors;
said second and fourth chain islands of the same type of MOSFET transistor, said first and third MOSFET types differing from said second and fourth MOSFET types;
said second and fourth chains comprising of a voltage threshold type, said second and fourth chains having a different voltage threshold type from one another; and,
via-configurable interconnections among the four chain islands of transistors; wherein, said ASIC is configured through said via-configurable interconnections.

6. The semiconductor device according to claim 5:
further comprising power and ground lines, said via-configurable interconnections connecting said chain islands to at least one of the power line and ground lines; and,
said second chain island in-between said first and third chain islands, substantially equidistant from said first and third chain islands;
said ASIC forms an electronic device selected from the group consisting of an inverter, NAND, latch and a macro; and,
said semiconductor device having feature sizes associated with a 28 nm CMOS process lithographic node and smaller.

7. The semiconductor device according to claim 3, wherein said second chain island is in-between said first and third chain islands, and further comprising a fourth transistor chain island next to the third chain island and comprised of MOSFET transistors;
wherein said second and fourth chain islands are of the same type of MOSFET transistor, said first and third MOSFET types differing from said second and fourth MOSFET types;
said first, second, third and fourth chains comprising of a voltage threshold type, said first and third chains having a different voltage threshold type from one another and said second and fourth chains having a different voltage threshold type from one another; and,
via-configurable interconnections among the four chain islands of transistors; wherein, said ASIC is configured through said via-configurable interconnections.

8. The semiconductor device according to claim 3:
said second chain island disposed in-between said first and third chain islands;
the semiconductor device further comprising:
a fourth chain island of serially connected MOSFET transistors;
a fifth chain island of serially connected MOSFET transistors;
a sixth chain island of serially connected MOSFET transistors;
said fifth chain island disposed in-between said fourth and sixth chain islands;
an imaginary dividing line dividing said first, second, third chain islands from said fourth, fifth and sixth chain islands, with said first and fourth chain islands disposed closest to said imaginary dividing line;
a seventh chain island of serially connected MOSFET transistors, said seventh chain disposed with said first, second and third chain islands and furthest from said imaginary dividing line;

an eighth chain island of serially connected MOSFET transistors, said eighth chain disposed with said fourth, fifth and sixth chain islands and furthest from said imaginary dividing line;

said first, second, third, fourth, fifth, sixth, seventh and eighth chain islands forming a symmetrical structure about said imaginary dividing line bisecting the chain islands, said third and fourth chain islands closest to said bisecting imaginary dividing line;

a first set of equivalent transistor chains selected from at least one of said first, second, third, fourth, fifth, sixth, seventh and eighth chain islands on both sides of said bisecting line, said first set of equivalent transistors having substantially the same predetermined drive strength of X, where X=a rational number;

a second set of equivalent transistor chains selected from at least one of said first, second, third, fourth, fifth, sixth, seventh and eighth chain islands on both sides of said bisecting line, said second set of equivalent transistors having substantially the same predetermined drive strength of Y, where Y=a rational number, Y not equal to X; and, a third set of equivalent transistor chains selected from at least one of said first, second, third, fourth, fifth, sixth, seventh and eighth chain islands on both sides of said bisecting line, said third set of equivalent transistor chains formed into devices that are selected from transistor chains having voltage threshold types selected from the group comprising LVT, SVT and HVT voltage threshold types.

9. The semiconductor device according to claim 3:
wherein said first transistor chain island is formed into devices that are selected from a first voltage threshold group consisting of LVT, SVT and HVT devices, said third transistor chain island is selected from a second voltage threshold group consisting of LVT, SVT and HVT devices, wherein said third transistor chain island is formed into a device from a voltage threshold group that is different from the voltage threshold group of said first transistor chain island.

10. The semiconductor device according to claim 9:
further comprising power and ground lines;
said via-configurable interconnections connecting said chain islands to at least one of the power line and ground lines; and,
said second chain island is in-between said first and third chain islands, substantially equidistant from said first and third chain islands.

11. The semiconductor device according to claim 10:
said via-configurable interconnections are vias that are filled on a single via-configurable layer;
said ASIC forms an electronic device selected from the group consisting of an inverter, NAND, latch and a macro.

12. A semiconductor device for an ASIC comprising:
a first nFET transistor chain island of serially connected nMOSFET transistors;
a second nFET transistor chain island of serially connected nMOSFET transistors;
a first pFET transistor chain island of serially connected pMOSFET transistors;
a second pFET transistor chain island of serially connected pMOSFET transistors;
said first nFET chain island, said second nFET chain island, said first pFET chain island and said second pFET chain island forming a symmetrical structure about an imaginary line bisecting said chain islands, with said first and second nFET transistor chains on one side of said bisecting imaginary line and said first and second pFET transistor chains on the other side of said bisecting imaginary line; said first nFET and said first pFET chain islands closest to said bisecting imaginary line;

at least one of said pFET chain islands and at least one of said nFET chain islands formed from devices having voltage thresholds selected from a voltage threshold group consisting LVT, SVT and HVT devices, all of said at least one pFET chain island and at least one nFET chain island having voltage thresholds sharing the same voltage thresholds group about said bisecting imaginary line;

a first pair of equivalent transistor chains selected from at least one set of transistor chains from said first nFET chain island, said second nFET chain island, said first pFET chain island and said second pFET chain island on both sides of said bisecting line, said first pair of equivalent transistor chains having substantially the same predetermined drive strength of X, where X=a rational number;

a second pair of equivalent transistor chains selected from at least one set of transistor chains of said first nFET chain island, said second nFET chain island, said first pFET chain island and said second pFET chain island on both sides of said bisecting line, said second pair of equivalent transistors having substantially the same predetermined drive strength of Y, where Y=a rational number, Y not equal to X; and, via-configurable interconnections among the transistor chain islands, said ASIC is configured through said via-configurable interconnections; and, said via-configurable interconnections are vias that are filled on a via configurable layer.

13. The semiconductor device according to claim 12, further comprising:
a first plurality of nFET transistor chain islands of serially connected nMOSFET transistors;
a second plurality of pFET transistor chain islands of serially connected pMOSFET transistors;
said first plurality of nFET chain islands and said second plurality of nFET chain islands forming a symmetrical structure about said imaginary line bisecting said chain islands;
at least one of said plurality of nFET chain islands and at least one of said plurality of pFET chain islands formed from devices having voltage thresholds selected from a voltage threshold group consisting LVT, SVT and HVT devices, all of said at least one of said plurality of nFET chain island and at least one said plurality of pFET chain island having voltage thresholds sharing the same voltage thresholds group about said bisecting imaginary line;
said voltage thresholds of said at least one of said plurality of nFET chain islands and at least one of said plurality of pFET chain islands are different from said voltage thresholds of said at least one of said first and second nFET transistor chains and at least one of said first and second pFET transistor chains; and,
wherein said semiconductor device chain islands have a plurality of voltage thresholds.

14. The semiconductor device according to claim 13, further comprising:
said first pair of equivalent transistor chains selected from at least one set of transistor chains from said first plurality of nFET chain islands, said first nFET transistor chain, said second nFET transistor chain, said second plurality of pFET chain islands, said first pFET transistor chain and said second pFET transistor chain, said first pair of equivalent transistor chains having substantially the same predetermined drive strength of X, where X=a rational number;

said second pair of equivalent transistor chains selected from at least one set of transistor chains from said first plurality of nFET chain islands, said first nFET transistor chain, said second nFET transistor chain, said second plurality of pFET chain islands, said first pFET transistor chain and said second pFET transistor chain, said second pair of equivalent transistor chains having substantially the same predetermined drive strength of Y, where Y=a rational number, Y not equal to X; and wherein said semiconductor device chain islands have a plurality of transistor drive strengths.

* * * * *